(12) United States Patent
Harari et al.

(10) Patent No.: US 8,291,295 B2
(45) Date of Patent: *Oct. 16, 2012

(54) NAND FLASH MEMORY CONTROLLER EXPORTING A NAND INTERFACE

(75) Inventors: Eliyahou Harari, Saratoga, CA (US); Richard R. Heye, Sunnyvale, CA (US); Robert D. Selinger, San Jose, CA (US); Menahem Lasser, Kohav-Yair (IL)

(73) Assignee: SanDisk IL Ltd., Kfar Saba (IL)

( * ) Notice: Subject to any disclaimer, the term of this patent is extended or adjusted under 35 U.S.C. 154(b) by 385 days.

This patent is subject to a terminal disclaimer.

(21) Appl. No.: 12/539,417

(22) Filed: Aug. 11, 2009

(65) Prior Publication Data
US 2010/0023800 A1    Jan. 28, 2010

Related U.S. Application Data

(63) Continuation-in-part of application No. 11/326,336, filed on Jan. 6, 2006, now Pat. No. 7,631,245.

(60) Provisional application No. 60/720,098, filed on Sep. 26, 2005.

(51) Int. Cl.
*G11C 29/00* (2006.01)
(52) U.S. Cl. ............... 714/763; 365/185.09; 365/185.33
(58) Field of Classification Search .................. 714/763; 365/185.09, 185.33
See application file for complete search history.

(56) References Cited

U.S. PATENT DOCUMENTS

| | | |
|---|---|---|
| 5,325,337 A | 6/1994 | Buttar |
| 5,404,485 A | 4/1995 | Ban |
| 5,434,825 A | 7/1995 | Harari |
| 5,532,962 A | 7/1996 | Auclair et al. |
| 5,799,168 A | 8/1998 | Ban |
| 5,818,757 A | 10/1998 | So et al. |

(Continued)

FOREIGN PATENT DOCUMENTS

EP          1 146 428          10/2001

(Continued)

OTHER PUBLICATIONS

"Notification of the First Office Action" (with translation) for Chinese patent application No. 200680035631.0, 14 pages, Jul. 13, 2010.

(Continued)

*Primary Examiner* — Esaw Abraham
(74) *Attorney, Agent, or Firm* — Brinks Hofer Gilson & Lione

(57) ABSTRACT

A NAND controller for interfacing between a host device and a flash memory device (e.g., a NAND flash memory device) fabricated on a flash die is disclosed. In some embodiments, the presently disclosed NAND controller includes electronic circuitry fabricated on a controller die, the controller die being distinct from the flash die, a first interface (e.g. a host-type interface, for example, a NAND interface) for interfacing between the electronic circuitry and the flash memory device, and a second interface (e.g. a flash-type interface) for interfacing between the controller and the host device, wherein the second interface is a NAND interface. According to some embodiments, the first interface is an inter-die interface. According to some embodiments, the first interface is a NAND interface. Systems including the presently disclosed NAND controller are also disclosed. Methods for assembling the aforementioned systems, and for reading and writing data using NAND controllers are also disclosed.

45 Claims, 18 Drawing Sheets

U.S. PATENT DOCUMENTS

| | | | |
|---|---|---|---|
| 5,928,370 A | 7/1999 | Asnaashari | |
| 5,937,425 A | 8/1999 | Ban | |
| 5,943,283 A | 8/1999 | Wong et al. | |
| 6,014,755 A | 1/2000 | Wells et al. | |
| 6,034,882 A | 3/2000 | Johnson et al. | |
| 6,119,245 A | 9/2000 | Hiratsuka | |
| 6,119,260 A | 9/2000 | Tomisawa et al. | |
| 6,181,599 B1 | 1/2001 | Gongwer | |
| 6,185,122 B1 | 2/2001 | Johnson et al. | |
| 6,230,233 B1 | 5/2001 | Lofgren et al. | |
| 6,339,546 B1 | 1/2002 | Katayama et al. | |
| 6,420,215 B1 | 7/2002 | Knall et al. | |
| 6,426,893 B1 | 7/2002 | Conley et al. | |
| 6,498,851 B1 | 12/2002 | Wong | |
| 6,591,330 B2 | 7/2003 | Lasser | |
| 6,594,183 B1 | 7/2003 | Lofgren et al. | |
| 6,624,773 B2 | 9/2003 | Wong | |
| 6,631,085 B2 | 10/2003 | Kleveland et al. | |
| 6,683,817 B2 | 1/2004 | Wei et al. | |
| 6,694,415 B2 | 2/2004 | March et al. | |
| 6,715,044 B2 | 3/2004 | Lofgren et al. | |
| 6,721,820 B2 | 4/2004 | Zilberman et al. | |
| 6,738,937 B1 | 5/2004 | Bergsten | |
| 6,751,155 B2 | 6/2004 | Gorobets | |
| 6,754,765 B1 | 6/2004 | Chang et al. | |
| 6,760,805 B2 | 7/2004 | Lasser | |
| 6,769,087 B2 | 7/2004 | Moro et al. | |
| 6,778,436 B2 | 8/2004 | Piau et al. | |
| 6,859,856 B2 | 2/2005 | Piau et al. | |
| 6,973,613 B2 | 12/2005 | Cypher | |
| 6,988,175 B2 | 1/2006 | Lasser | |
| 7,012,835 B2 | 3/2006 | Gonzalez et al. | |
| 7,076,667 B1 | 7/2006 | Gama et al. | |
| 7,081,377 B2 | 7/2006 | Cleeves | |
| 7,096,313 B1 | 8/2006 | Chang et al. | |
| 7,120,729 B2 | 10/2006 | Gonzalez et al. | |
| 7,136,973 B2 | 11/2006 | Sinclair | |
| 7,149,111 B2 | 12/2006 | Murin et al. | |
| 7,149,119 B2 | 12/2006 | Fasoli | |
| 7,170,788 B1 | 1/2007 | Wan et al. | |
| 7,171,536 B2 | 1/2007 | Chang et al. | |
| 7,177,191 B2 | 2/2007 | Fasoli | |
| 7,177,977 B2 | 2/2007 | Chen et al. | |
| 7,184,306 B2 | 2/2007 | Conley et al. | |
| 7,187,583 B2 | 3/2007 | Yang et al. | |
| 7,191,379 B2 | 3/2007 | Adelmann et al. | |
| 7,218,552 B1 | 5/2007 | Wan et al. | |
| 7,219,271 B2 | 5/2007 | Kleveland et al. | |
| 7,224,607 B2 | 5/2007 | Gonzalez et al. | |
| 7,225,357 B2 | 5/2007 | Tai et al. | |
| 7,234,049 B2 | 6/2007 | Choi et al. | |
| 7,239,556 B2 | 7/2007 | Abe et al. | |
| 7,262,994 B2 | 8/2007 | Fong et al. | |
| 7,295,473 B2 | 11/2007 | Fong et al. | |
| 7,305,596 B2 | 12/2007 | Noda et al. | |
| 7,330,995 B2 * | 2/2008 | Shiraishi et al. | 714/2 |
| 7,340,581 B2 | 3/2008 | Gorobets et al. | |
| 7,345,907 B2 | 3/2008 | Scheuerlein | |
| 7,349,258 B2 | 3/2008 | Fong et al. | |
| 7,355,888 B2 | 4/2008 | Hemink et al. | |
| 7,355,889 B2 | 4/2008 | Hemink et al. | |
| 7,362,604 B2 | 4/2008 | Scheuerlein | |
| 7,366,029 B2 | 4/2008 | Kagan | |
| 7,379,330 B2 | 5/2008 | Conley et al. | |
| 7,379,334 B2 | 5/2008 | Murakami et al. | |
| 7,392,343 B2 | 6/2008 | Oshima | |
| 7,406,572 B1 | 7/2008 | Nguyen | |
| 7,426,137 B2 | 9/2008 | Hemink | |
| 7,433,241 B2 | 10/2008 | Dong et al. | |
| 7,436,713 B2 | 10/2008 | Hemink | |
| 7,440,318 B2 | 10/2008 | Fong et al. | |
| 7,440,323 B2 | 10/2008 | Lutze et al. | |
| 7,443,736 B2 | 10/2008 | Samachisa | |
| 7,447,065 B2 | 11/2008 | Fong et al. | |
| 7,447,066 B2 | 11/2008 | Conley et al. | |
| 7,450,430 B2 | 11/2008 | Hemink et al. | |
| 7,457,997 B2 | 11/2008 | Norman et al. | |
| 7,463,531 B2 | 12/2008 | Hemink et al. | |
| 7,464,259 B2 * | 12/2008 | Sukegawa et al. | 713/2 |
| 7,468,911 B2 | 12/2008 | Lutze et al. | |
| 7,468,918 B2 | 12/2008 | Dong et al. | |
| 7,475,184 B2 | 1/2009 | Lee | |
| 7,477,547 B2 | 1/2009 | Lin | |
| 7,483,228 B2 * | 1/2009 | Song et al. | 360/31 |
| 7,490,258 B2 | 2/2009 | Sakamoto et al. | |
| 7,495,956 B2 | 2/2009 | Fong et al. | |
| 7,499,326 B2 | 3/2009 | Hemink | |
| 7,516,371 B2 | 4/2009 | Sakaue et al. | |
| 7,584,308 B2 | 9/2009 | Gower et al. | |
| 7,584,336 B2 | 9/2009 | Tremaine | |
| 7,610,433 B2 * | 10/2009 | Randell et al. | 711/101 |
| 7,617,335 B2 | 11/2009 | Choi | |
| 7,631,245 B2 | 12/2009 | Lasser | |
| 7,657,696 B2 * | 2/2010 | Su et al. | 711/103 |
| 7,730,368 B2 * | 6/2010 | Murin et al. | 714/718 |
| 7,769,978 B2 * | 8/2010 | Gorobets et al. | 711/203 |
| 7,823,044 B2 * | 10/2010 | Simon | 714/763 |
| 7,830,711 B2 | 11/2010 | Kawamoto et al. | |
| 7,949,931 B2 | 5/2011 | Lastras-Montano | |
| 7,984,360 B2 | 7/2011 | Sharon et al. | |
| 8,059,455 B2 | 11/2011 | Stern et al. | |
| 8,078,923 B2 | 12/2011 | Nagadomi et al. | |
| 8,082,482 B2 | 12/2011 | Gower et al. | |
| 8,086,936 B2 | 12/2011 | Gower et al. | |
| 8,103,936 B2 | 1/2012 | Pekny et al. | |
| 8,127,200 B2 | 2/2012 | Sharon et al. | |
| 8,154,918 B2 | 4/2012 | Sharon et al. | |
| 2001/0028523 A1 | 10/2001 | Moro et al. | |
| 2003/0028704 A1 | 2/2003 | Mukaida et al. | |
| 2003/0051118 A1 | 3/2003 | Wu et al. | |
| 2003/0065899 A1 | 4/2003 | Gorobets | |
| 2003/0079077 A1 | 4/2003 | Piau et al. | |
| 2003/0097520 A1 | 5/2003 | Lai et al. | |
| 2003/0099134 A1 | 5/2003 | Lasser et al. | |
| 2003/0135688 A1 | 7/2003 | Tai | |
| 2003/0206442 A1 | 11/2003 | Tang et al. | |
| 2004/0003336 A1 | 1/2004 | Cypher | |
| 2004/0103234 A1 | 5/2004 | Zer et al. | |
| 2004/0205418 A1 | 10/2004 | Sakaue et al. | |
| 2005/0050235 A1 | 3/2005 | Choi | |
| 2005/0055479 A1 | 3/2005 | Zer et al. | |
| 2005/0092846 A1 | 5/2005 | Lai et al. | |
| 2005/0172065 A1 | 8/2005 | Keays | |
| 2005/0174833 A1 | 8/2005 | Hirabayashi | |
| 2005/0180209 A1 | 8/2005 | Lasser | |
| 2005/0185449 A1 | 8/2005 | Shiota et al. | |
| 2005/0207231 A1 | 9/2005 | Kim | |
| 2005/0232037 A1 | 10/2005 | Asari et al. | |
| 2005/0237814 A1 | 10/2005 | Li et al. | |
| 2005/0286306 A1 | 12/2005 | Srinivasan et al. | |
| 2006/0184709 A1 | 8/2006 | Sukegawa et al. | |
| 2006/0239450 A1 | 10/2006 | Holtzman et al. | |
| 2007/0011395 A1 | 1/2007 | Kim | |
| 2007/0047306 A1 | 3/2007 | Roohparvar | |
| 2007/0074093 A1 | 3/2007 | Lasser et al. | |
| 2007/0076478 A1 | 4/2007 | Sanders | |
| 2007/0088940 A1 | 4/2007 | Conley | |
| 2007/0140036 A1 | 6/2007 | Noguchi et al. | |
| 2007/0170268 A1 | 7/2007 | Lee | |
| 2007/0186040 A1 | 8/2007 | Kasahara et al. | |
| 2007/0220402 A1 | 9/2007 | Hagi et al. | |
| 2007/0263440 A1 | 11/2007 | Cornwell et al. | |
| 2008/0046630 A1 | 2/2008 | Lasser | |
| 2008/0046641 A1 | 2/2008 | Lasser | |
| 2008/0151618 A1 | 6/2008 | Sharon et al. | |
| 2008/0158948 A1 | 7/2008 | Sharon et al. | |
| 2008/0184094 A1 | 7/2008 | Murray et al. | |
| 2008/0235560 A1 | 9/2008 | Colmer et al. | |
| 2008/0243954 A1 | 10/2008 | Augenstein et al. | |
| 2008/0320214 A1 | 12/2008 | Ma et al. | |
| 2009/0044076 A1 | 2/2009 | Sugahara | |
| 2009/0113119 A1 | 4/2009 | Oribe et al. | |
| 2009/0172266 A1 | 7/2009 | Kimura | |
| 2009/0235013 A1 | 9/2009 | Seo | |
| 2009/0248952 A1 | 10/2009 | Radke et al. | |
| 2009/0248963 A1 | 10/2009 | Ito | |
| 2009/0316490 A1 | 12/2009 | Takada | |

| | | | |
|---|---|---|---|
| 2010/0023800 | A1 | 1/2010 | Harari et al. |
| 2010/0070681 | A1 | 3/2010 | Wan et al. |
| 2010/0180182 | A1 | 7/2010 | Trantham |
| 2010/0269021 | A1 | 10/2010 | Gower et al. |
| 2010/0293317 | A1 | 11/2010 | Confalonieri et al. |
| 2010/0315874 | A1 | 12/2010 | Ghodsi |
| 2010/0332942 | A1 | 12/2010 | Wezelenburg et al. |
| 2011/0022781 | A1 | 1/2011 | Wakrat et al. |
| 2011/0047441 | A1 | 2/2011 | Yamaga |
| 2011/0307667 | A1 | 12/2011 | Yano et al. |
| 2011/0307762 | A1 | 12/2011 | Tiziani et al. |
| 2011/0310666 | A1 | 12/2011 | Miida et al. |

FOREIGN PATENT DOCUMENTS

| | | |
|---|---|---|
| JP | H11-175403 | 7/1999 |
| JP | H11-297066 | 10/1999 |
| JP | 2004-118407 | 4/2004 |
| JP | 2004-280790 | 10/2004 |
| JP | 2006-309361 | 11/2006 |
| JP | 2006-323739 | 11/2006 |
| KR | 10-2001-0071254 | 7/2001 |
| WO | WO 2004/049168 | 6/2004 |
| WO | WO 2005/066773 | 7/2005 |
| WO | WO 2006/059772 | 6/2006 |
| WO | WO 2007/034481 | 3/2007 |
| WO | WO 2009/088920 | 7/2009 |

OTHER PUBLICATIONS

Ex Parte Quayle Action for U.S. Appl. No. 11/326,336, dated Jul. 30, 2009, 13 pages.
Office Action for U.S. Appl. No. 11/806,701 dated Jun. 22, 2009, 35 pages.
Office Action for U.S. Appl. No. 11/806,702, dated Jun. 18, 2009, 14 pages.
"Open NAND Flash Interface Specification", Revision 2.1, Jan. 14, 2009, pp. 1-201.
"Samsung Electronics Develops World's First Eight-Die Multi-Chip Package for Multimedia Cell Phones", http://www.samsung.com/us/business/seimconductor/newsView.do?news_id=628.0, Jan. 10, 2005.
Schwaderer, W. et al., "Understanding I/O Subsystems, First Edition", *Adaptec Press*, 1996, pp. ii-iii, 82-87, 176-191.
Serial ATA, "High Speed Serialized AT Attachment", Revision 1.0a, Jan. 7, 2003, 2 pages. (title page and p. 144).
Supplemental European Search Report and Opinion for European Patent Application No. 06796108.6, May 7, 2009, 8 pages.
Toshiba TC58NVG1S3BFT00/TC58NVG1S8BFT000 Tentative, Toshiba MOS Digital Integrated Circuit Silicon Gate CMOS, Oct. 30, 2003, pp. 1-37.
Toshiba TC58NVG2D4BFT00/TC58NVG2D9BFT000 Tentative, Toshiba MOS Digital Integrated Circuit Silicon Gate CMOS, Oct. 30, 2003, pp. 1-37.
U.S. Appl. No. 12/165,141 entitled, "Partial Scrambling to Reduce Correlation," filed Jun. 30, 2008, inventors: Ori Stern, Tal Heller, and Menahem Lasser.
U.S. Appl. No. 12/199,023 entitled, "A Portable Storage Device With an Accelerated Access Speed", filed Aug. 27, 2008, inventors: Judah Gamliel and Donald Ray Bryant-Rich.
U.S. Appl. No. 12/209,697 entitled, "Method for Scrambling Data in which Scrambling Data and Scrambled Data are Stored in Corresponding Non-Volatile Memory Locations," filed Sep. 12, 2008, inventors: Jun Wan, Yupin K. Fong, and Man L. Mui.
U.S. Appl. No. 12/251,820 entitled, "Method for Page- and Block Based Scrambling in Non-Volatile Memory," filed Oct. 15, 2008, inventors: Eran Sharon and Idan Alrod.
U.S. Appl. No. 12/539,394 entitled, "Controller and Method for Interfacing Between a Host Controller in a Host and a Flash Memory Device", filed Aug. 11, 2009, inventors: Eliyahou Harari, Richard R. Heye and Robert D. Selinger.
U.S. Appl. No. 12/539,407 entitled, "Controller and Method for Detecting a Transmission Error Over a NAND Interface Using Error Detection Code", filed Aug. 11, 2009, inventor: Robert D. Selinger.
U.S. Appl. No. 12/539,379 entitled, "Controller and Method for Providing Read Status and Spare Block Management Information in Flash Memory System", filed Aug. 11, 2009, inventor: Robert D. Selinger.
"USB 2.0 High-Speed Flash Drive Controller, ST72681", Revision Feb. 6, 2009 (previous revisions May 2005-Jan. 2009), pp. 1-34.
Wikipedia, "Southbridge (Computing)", http://en.wikipedia.org/wiki/Southbridge (computing), Retrieved on Aug. 4, 2009, pp. 1-2.
Extended European Search Report and Opinion for European Patent Application No. 09009022.6-1233, Sep. 21, 2009, 9 pages.
"ONFI Working on Next-Generation NAND Specifications: ONFI 3.0 and EZNAND," 1 page, Jan. 6, 2010.
"Micron NAND Flash Memory: MT29F4G08AAA, MT29F8G08BAA, MT29F8G08DAA, MT29F16G08FAA," http://download.micron.com/pdf/datasheets/flash/nand/4gb_nand_m40a.pdf, 1 page, 2006.
"Siemens Internal Flash Data Management," 2 pages, Siemens AG 2006.
Examination Report for EP Application No. 09009022.6-1233, 6 pages, May 4, 2010.
Examination Report for EP Application No. 06796108.6-1233, 5 pages, Feb. 17, 2010.
Notice of Ground for Refusal for Korean Patent Application No. 10-2008-7007225, 5 pages, May 11, 2010.
Office Action directed against U.S. Appl. No. 11/806,701, 27 pages, Feb. 25, 2010.
Office Action directed against U.S. Appl. No. 11/806,702, 9 pages, Feb. 25, 2010.
Cooke, J., Microsoft WinHec 2007, "Flash Memory Technology Direction", Apr. 30, 2007, pp. 1-11.
Cooke, J., Powerpoint Presentation, Flash Memory Summit, "NAND 101, An Introduction to NAND Flash and How to Design it in to Your Next Product", Aug. 8, 2006, pp. 1-68.
Denali Software, "Spectra™ NAND Flash File System", http://www.denali.com/en/products/spectra_ffs.jsp, copyright 1994-2009, retrieved on Aug. 6, 2009, pp. 1-3.
EE Times Asia, "Toshiba Mixes LBA to NAND Flash Memory", http://www.eetasia.com/ARTP_8800428816_499486.HTM, posted on Aug. 9, 2006, 1 page.
Grimsrud, K., Powerpoint Presentation, "Intel Developer Forum", 2007, pp. 1-30.
Heye, R., Powerpoint Presentation, "Microsoft WinHec 2008 Advancing the Platform-MLC NAND in the PC, Planning for Success", 2008, pp. 1-34.
"Innovation, Simplify Embedded NAND Flash Design", Adverstisement, 1 page.
Inoue, A. et al., "NAND Flash Applications Design Guide, System Solutions from Toshiba America Electronic Components, Inc.", Revision 1.0, Apr. 2003, pp. 1-29.
Roohparvar, F., Powerpoint Presentation, Flash Memory Summit, "The Future of Wireless Flash", Aug. 2006, pp. 1-29.
"Simplify MLC NAND Design with Toshiba Embedded NAND Solutions", http://www.toshiba.com/taec/adinfo/embeddednand/, retrieved on Aug. 4, 2009, 2 pages.
Toshiba LBA-NAND Simplifies Integration, http://www.toshiba.com/taec/adinfo/embeddednand/images/LBAblockDiagram.jpg, retrieved on Aug. 4, 2009, 1 page.
Cooke, "Micron e-MMC Embedded Memory Simplifies High Capacity Storage for Mobile and Embedded Solutions," 2007, 7 pages.
Abraham, "Flash Standards for Embedded Systems," Aug. 2008, 22 pages.
"Method for Page- and Block Based Scrambling in Non-Volatile Memory," U.S. Appl. No. 12/251,820, filed Oct. 15, 2008, inventors: Eran Sharon and Idan Alrod.
"Method for Scrambling Data in which Scrambling Data and Scrambled Data are Stored in Corresponding Non-Volatile Memory Locations," U.S. Appl. No. 12/209,697, filed Sep. 12, 2008, inventors: Jun Wan, Yupin K. Fong, and Man L. Mui.
"Partial Scrambling to Reduce Correlation," U.S. Appl. No. 12/165,141, filed Jun. 30, 2008, inventors: Ori Stern, Tal Heller, and Menahem Lasser.

"System, Method and Memory Device Providing Data Scrambling Compatible with On-Chip Copy Operation," International Application No. PCT/US08/88625, filed Dec. 31, 2008, inventors: Jason T. Lin, Steven S. Cheng, and Shai Traister.

Koh W., "System in Package (SiP) Technology Applications", *IEEE 2005 6th International Conference on Electronic Packaging Technology*, Aug. 30-Sep. 2, 2005, pp. 61-66.

U.S. Appl. No. 11/808,906 entitled, "Flash Memory Device and System with Randomizing for Suppressing Errors," filed Jun. 13, 2007, inventors: Eran Sharon and Idan Alrod.

U.S. Appl. No. 11/876,789 entitled, "Avoiding Errors in a Flash Memory by Using Substitution Transformations," filed Oct. 23, 2007, inventors: Eran Sharon, Simon Litsyn, and Idan Alrod.

Notice of Allowance for U.S. Appl. No. 11/326,336, dated Oct. 20, 2009, 6 pages.

Office Action for U.S. Appl. No. 11/806,701, dated Dec. 22, 2010, 26 pages.

Office Action for U.S. Appl. No. 11/806,701, dated Jun. 22, 2011, 26 pages.

Office Action for U.S. Appl. No. 11/806,702, dated Dec. 27, 2010, 8 pages.

Office Action for U.S. Appl. No. 11/806,702, dated Jun. 21, 2011, 9 pages.

Restriction Requirement for U.S. Appl. No. 12/539,379, dated Apr. 20, 2011, 7 pages.

Office Action for U.S. Appl. No. 12/539,379, dated Jul. 13, 2011, 13 pages.

Office Action for U.S. Appl. No. 12/539,379, dated Jan. 24, 2012, 13 pages.

Office Action for U.S. Appl. No. 12/539,394, dated Mar. 13, 2012, 8 pages.

Office Action for U.S. Appl. No. 12/539,407, dated Jan. 23, 2012, 18 pages.

Notice of Allowance for U.S. Appl. No. 12/610,868, dated Sep. 22, 2010, 8 pages.

Supplemental Notice of Allowance for U.S. Appl. No. 12/610,868 dated Dec. 29, 2010, 4 pages.

Second Office Action for Chinese Patent Application Serial No. 200680035631.0, dated Mar. 17, 2011, 21 pages.

Examination Report for European Patent Application Serial No. 06796108.6, dated Aug. 28, 2009, 1 page.

Reasons of Rejection for Japanese Patent Application Serial No. 2008-531880, dated Oct. 22, 2010, 4 pages.

Notice of Grounds for Refusal for Korean Patent Application Serial No. 10-2008-7007225, dated Aug. 31, 2009, 9 pages.

Final Rejection for Korean Patent Application Serial No. 10-2008-7007225, dated Nov. 25, 2010, 3 pages.

Grounds for Rejection for Korean Patent Application Serial No. 10-2009-7027656, dated Jul. 27, 2011, 6 pages.

International Search Report and Written Opinion for PCT/IL07/001041, dated May 7, 2008, 16 pages.

International Preliminary Report on Patentability for PCT/IL07/001041, dated Feb. 24, 2009, 9 pages.

International Search Report for PCT/IL06/01101, dated Jun. 21, 2007, 1 page.

Written Opinion for PCT/IL06/01101, dated Jun. 21, 2007, dated Jun. 21, 2007, 3 pages.

International Preliminary Report on Patentability for PCT/IL06/01101, dated Mar. 26, 2008, 4 pages.

International Search Report for PCT/US10/044685, dated May 9, 2011, 4 pages.

Written Opinion for PCT/US10/044685, dated Feb. 11, 2012, 5 pages.

International Preliminary Report on Patentability for PCT/US10/044685, dated Feb. 14, 2012, 6 pages.

International Search Report for PCT/US10/044695, dated Nov. 19, 2010, 3 pages.

Written Opinion for PCT/US10/044695, dated Feb. 11, 2012, 8 pages.

International Preliminary Report on Patentability for PCT/US10/044695, dated Feb. 14, 2012, 9 pages.

International Search Report for PCT/US10/044701, dated Feb. 25, 2011, 6 pages.

Written Opinion for PCT/US10/044701, dated Feb. 11, 2012, 10 pages.

International Preliminary Report on Patentability for PCT/US10/044701, dated Feb. 14, 2012, 11 pages.

Office Action for Taiwanese Application Serial No. 096130794, dated Dec. 29, 2010, 15 pages.

Office Action for U.S. Appl. No. 12/539,394, dated Jun. 26, 2012, 8 pages.

Office Action for Taiwanese Patent Application U.S. Appl. No. 096130794, dated Apr. 26, 2012, 7 pages.

Notice of Final Rejection for Korean Patent Application No. 10-2009-7027656, dated Jun. 29, 2012, 4 pages.

Office Action for U.S. Appl. No. 12/539,407, dated Jul. 20, 2012, 7 pages.

Office Action/Interrogation for Japanese patent application No. 2008-531880, 5 pages, May 11, 2012.

\* cited by examiner

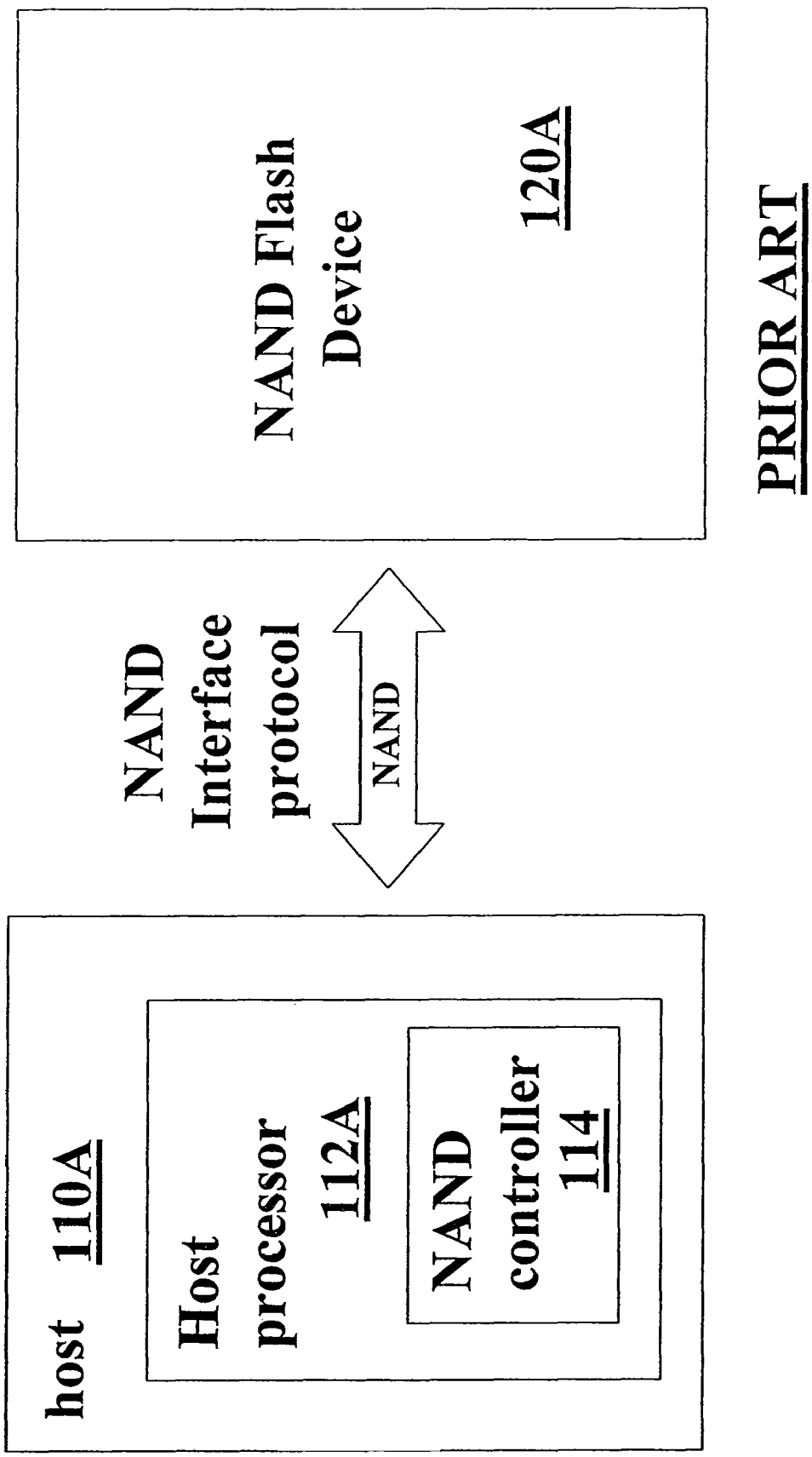

NAND FLASH MEMORY CONTROLLER EXPORTING A NAND INTERFACE

CROSS-REFERENCE TO RELATED APPLICATIONS

This patent application is a continuation-in-part of U.S. patent application Ser. No. 11/326,336, filed Jan. 6, 2006 (now U.S. Pat. No. 7,631,245), which claims the benefit of U.S. Provisional Patent Application No. 60/720,098, filed Sep. 26, 2005 (now abandoned).

FIELD OF THE INVENTION

The present invention relates to NAND flash memory controllers that export to the host computer the same type of interface that is exported by a standard NAND flash memory device.

BACKGROUND OF THE INVENTION

Single Bit and Multi-Bit Flash Memory Cells

Flash memory devices have been known for many years. Typically, each memory cell within a flash memory device stores one bit of information. The traditional way to store a bit in a flash memory cell has been by supporting two states of the memory cell. One state represents a logical "0" and the other state represents a logical "1".

In a flash memory cell, the two states are implemented by having a floating gate situated above the cell's channel (the area connecting the source and drain elements of the cell's transistor), and having two valid states for the amount of charge stored within the floating gate. Typically, one state is with zero charge in the floating gate and is the unwritten state of the cell after being erased (commonly defined to represent the "1" state) and the other state is with some amount of negative charge in the floating gate (commonly defined to represent the "0" state). Having negative charge in the gate causes the threshold voltage of the cell's transistor (i.e. the voltage that has to be applied to the transistor's control gate in order to cause the transistor to conduct) to increase. It is possible to read the stored bit by checking the threshold voltage of the cell. If the threshold voltage is in the higher state then the bit value is "0" and if the threshold voltage is in the lower state then the bit value is "1". Actually there is no need to accurately read the cell's threshold voltage. All that is needed is to correctly identify in which of the two states the cell is currently located. For this purpose it is sufficient to compare the threshold voltage of the cell to a reference voltage that is between the two states, and to determine if the cell's threshold voltage is below or above the reference value.

FIG. 1A (prior art) shows graphically how this works. Specifically, FIG. 1A shows a distribution of the threshold voltages of a large population of cells. Because the cells in a flash device are not exactly identical in their characteristics and behavior (due to, for example, small variations in impurity concentrations or defects in the silicon structure), applying the same programming operation to all of the cells does not cause all of the cells to have exactly the same threshold voltage. Instead, the threshold voltage is distributed as shown in FIG. 1A. Cells storing a value of "1" typically have a negative threshold voltage, such that most of the cells have a threshold voltage close to the central voltage value of the left peak (labeled 1) of FIG. 1A, with fewer cells having threshold voltages lower or higher than the central voltage of the left peak. Similarly, cells storing a value of "0" typically have a positive threshold voltage, such that most of the cells have a threshold voltage close to the central voltage of the right peak (labeled 0) of FIG. 1A, with fewer cells having threshold voltages lower or higher than the central voltage of the right peak.

In recent years, a new kind of flash device has appeared on the market, using "Multi Level Cells" (MLC). The term "Multi-Level Cell" is misleading because flash memory with a single bit per cell uses multiple i.e. two levels, as described above. Therefore, the term "Single Bit Cell" (SBC) is used hereinafter to refer to a memory cell of two levels and the term "Multi-Bit Cell" (MBC) is used hereinafter to refer to a memory cell of more than two levels, i.e. more than one bit per cell. The most common MBC flash memories at present are ones with two bits per cell, and therefore examples are given below using such MBC memories. It should however be understood that the present invention is equally applicable to flash memory devices that support more than two bits per cell. A single MBC cell storing two bits of information is in one of four different states. As the cell's "state" is represented by the cell's threshold voltage, an MBC cell supports four different valid ranges for the cell's threshold voltage. FIG. 1B (prior art) shows the threshold voltage distribution for a typical MBC cell of two bits per cell. As expected, FIG. 1B has four peaks, each peak corresponding to one state. As for the SBC, each state is actually a voltage range and not a single voltage. When reading the cell's contents, the cell's threshold voltage must be correctly identified in a definite voltage range. For a prior art example of an MBC flash device see U.S. Pat. No. 5,434,825 to Harari that is included by reference for all purposes as if fully set forth herein.

A cell designed for MBC operation e.g. in four states is typically operable as an SBC cell with two states. For example, Conley et al. in U.S. Pat. No. 6,426,893 incorporated by reference for all purposes as if fully set forth herein, disclosed the use of both MBC and SBC modes within the same device, and selecting certain parts of the device to operate with highest density in MBC mode, while other parts are used in SBC mode to provide better performance.

MBC devices provide a significant cost advantage. An MBC device with two bits per cell requires about half the area of a silicon wafer than an SBC of similar capacity. However, there are drawbacks to using MBC flash. Average read and write times of MBC memories are longer than of SBC memories, resulting in worse performance. Also, the reliability of MBC is lower than SBC. The differences between the threshold voltage ranges in MBC are much smaller than in SBC. Thus, a disturbance in the threshold voltage (e.g leakage of stored charge causing a threshold voltage drift or interference from operating neighboring cells) that are insignificant in SBC because of the large gap between the two states, may cause an MBC cell to move from one state to another, resulting in an erroneous bit. The end result is a lower performance specification of MBC cells in terms of data retention time or the endurance of the device to many write/erase cycles.

NAND Flash Memory Devices

Flash memory devices are typically divided into NOR devices and NAND devices, the names being derived from the way the individual memory cells are interconnected within the cells array. NOR devices are random access—a host computer accessing a NOR flash device can provide the device any address on its address pins and immediately retrieve data stored in that address on the device's data pins. This is much like SRAM or EPROM memories operate. NAND devices, on the other hand, are not random access but serial access. It is not possible to access any random address in the way described above for NOR—instead the host has to write into the device a sequence of bytes which identifies both the type of the requested command (e.g. read, write, erase, etc.) and the address to be used for that command. The address identifies a page (the smallest chunk of flash memory that can we written in a single operation) or a block (the smallest chunk of flash memory that can be erased in a single operation), and not a single byte or word. It is true that the read and write command sequences contain addresses of single bytes or words, but in reality the NAND flash device always reads from the memory cells and writes to the memory cells complete pages. After a page of data is read from the array into a buffer inside the device, the host can access the data bytes or words one by one by serially clocking them out using a strobe signal.

Because of the non-random access of NAND devices, they cannot be used for running code directly from the flash memory. This is contrary to NOR devices which support direct code execution (typically called "eXecution In Place" or "XIP"). Therefore NOR devices are the ones typically used for code storage. However, NAND devices have advantages that make them very useful for data storage. NAND devices are cheaper than NOR devices of the same bit capacity, or equivalently—NAND devices provide many more bits of storage than NOR devices for the same cost. Also, the write and erase performance of NAND devices is much faster than of NOR devices. These advantages make the NAND flash memory technology the technology of choice for storing data.

NAND Interface Protocols

A typical SBC NAND device is Toshiba TC58NVG1S3B that provides 2 Gbit of storage. A typical MBC NAND device is Toshiba TC58NVG2D4B that provides 4 Gbit of storage. The data sheets of both devices are incorporated by reference for all purposes as if fully set forth herein.

As can be seen from the aforementioned data sheets, those two NAND devices have a similar interface. These NAND devices use the same electrical signals for coordinating commands and data transfer between the NAND flash device and a host device. Those signals include data lines and a few control signals—ALE (Address Latch Enable), CLE (Command Latch Enable), WE\ (Write Enable), and more. The SBC and MBC devices are not fully identical in their behavior—the time it takes to write an MBC page is much longer than time it takes to write an SBC page. However, the electrical signals used in both devices and their functionalities are the same. This type of interface protocol is known in the art as "NAND interface". Even though the "NAND interface protocol" has not, to date, been formally standardized by a standardization body, the manufacturers of NAND flash devices all follow the same protocol for supporting the basic subset of NAND flash functionality. This is done so that customers using NAND devices within their electronic products could use NAND devices from any manufacturer without having to tailor their hardware or software for operating with the devices of a specific vendor. It is noted that even NAND vendors that provide extra functionality beyond this basic subset of functionality ensure that the basic functionality is provided in order to provide compatibility with the protocol used by the other vendors, at least to some extent.

In this application the term "NAND Interface protocol" (or "NAND interface" in short) means an interface protocol between an initiating device and a responding device that in general follows the protocol between a host device and a NAND flash device for the basic read, write and erase operations, even if it is not fully compatible with all timing parameters, not fully compatible with respect to other commands supported by NAND devices, or contains additional commands not supported by NAND devices. In other words, the term "NAND interface" refers to any interface protocol that uses sequences of transferred bytes equivalent in functionality to the sequences of bytes used when interfacing with the Toshiba TC58NVG1S3B NAND device for reading (opcode 00H), writing (opcode 80H) and erasing (opcode 60H), and also uses control signals equivalent in functionality to the CLE, ALE, CE, WE and RE signals of the above NAND device.

It is noted that the "NAND interface protocol" is not symmetric. Thus, it is always the host device which initiates the interaction over a NAND interface, and never the flash device.

A given device (e.g. a controller, flash device, host device, etc.) is said to comprise, include or have a "NAND interface" if the given device includes elements (e.g. hardware, software, firmware or any combination thereof) necessary for supporting the NAND interface protocol (e.g. for interacting with another device using a NAND interface protocol).

An interface (e.g. a NAND interface or an interface associated with another protocol) of a given device (e.g. a controller device) may be a "host-side interface" (e.g. the given device is adapted to interact with a host device using the host-side interface) or the interface of the given device may be a "flash memory device-side interface" (e.g. the given device is adapted to interact with a flash memory device using the flash memory device-side interface). The terms "flash memory device-side interface", "flash device-side interface" and "flash-side interface" are used herein interchangeably.

These terms (i.e. "host-side interface" and "flash device-side interface") should not be confused with the terms "host-type interface" and "flash-type interface" which are terminology used herein to differentiate between the two sides of a NAND interface protocol, as this protocol is not symmetric. Furthermore, because it is always the host that initiates the interaction, we note that a given device is said to have a "host-type interface" if the device includes the necessary hardware and/or software for implementing the host side of the NAND interface protocol (i.e. for presenting a NAND host, and initiating the NAND protocol interaction) Similarly, because the flash device never initiates the interaction, we note that a given device is said to have a "flash-type interface" if the device includes the necessary hardware and/or software for implementing the flash side of the NAND protocol (i.e. for presenting a NAND flash device).

Typically, "host-type interfaces" (i.e. those which play the role of the host) are "flash device-side interfaces" (i.e. they interact with flash devices or with hardware emulating a flash device) while "flash device-type interfaces" (i.e. those which play the role of the flash device) are typically "hosts-side interfaces" (i.e. they interact with host devices or with hardware emulating a host device). In this application the term "host device" (or "host" in short) means any device that has processing power and is capable of interfacing with a flash memory device. A host device may be a personal computer, a PDA, a cellular phone, a game console, etc.

Typically, NAND devices are relatively difficult to interface and work with. One reason for that is the relatively complex (compared to NOR devices) protocol for accessing them, as described above. Another difficulty is the existence of errors in the data read from NAND devices, In contrast, NOR devices that can be assumed to always return correct data. This inherent non-reliability of NAND devices requires the use of Error Detection Codes (EDC) and Error Correction Codes (ECC).

Manufacturers of SBC NAND flash devices typically advise users to apply an Error Correction Code capable of correcting 1 bit error in each page of 512 bytes of data. But data sheets of MBC NAND flash devices typically advise applying an ECC capable of correcting 4 bit errors in each page of 512 bytes of data. For pages of size 2048 bytes such as in the case of the NAND devices mentioned above (known as "large block devices"), the suggestion is to apply error correction per each portion of 512 bytes of the page. In this application the term "N-bit ECC" refers to an ECC scheme capable of correcting N bit errors in 512 bytes of data, regardless if the 512 bytes are the size of one page, less than one page, or more than one page.

NAND Controllers

Because of those complexities of NAND devices, it is the common practice to use a "NAND controller" for controlling the use of a NAND device in an electronic system. It is true that it is possible to operate and use a NAND device directly by a host device with no intervening NAND controller, and there are systems that actually operate like this. However, this architecture suffers from many disadvantages. First, the host has to individually manipulate each one of the NAND device's control signals (e.g. CLE or ALE), which is cumbersome and time-consuming for the host. Second, the support of EDC and ECC puts a severe burden on the host—parity bits have to be calculated for each page written, and error detection calculations (and sometimes also error correction calculations) must be performed by the host. All this makes such "no controller" architecture relatively slow and inefficient.

Using a NAND controller significantly simplifies the host's tasks when using the NAND device. The processor interacts with the controller using a protocol that is much more convenient to use—a request for writing a page may be sent as a single command code followed by address and data, instead of having to bother with the complex sequencing of control lines and NAND command codes. The controller then converts the host-controller protocol into the equivalent NAND protocol sequences, while the host is free to do other tasks (or just to wait for the NAND operation to complete, if so desired).

There are several options in the prior art regarding the location where the NAND controller resides within the system. A first approach is shown in FIG. 2. Here the NAND controller 114 is physically located within the host processor 112A of the host device 110A. If the host processor 112A is implemented as a single die, then the controller 114 is incorporated on the same die. This is for example the case in some of the OMAP processors manufactured and sold by Texas Instruments. In a system built using this architecture the host processor typically interacts with the NAND controller using some proprietary protocol, as the interaction is internal to the host processor and there is no benefit in using a standard protocol.

A second prior art approach is shown in FIGS. 3A-3B. Here the NAND controller 116 is a separate physical element, residing between the host processor 112B of the host 110B and the NAND device 120A. This is for example the case in portable USB Flash Drives (UFDs), such as the DiskOnKey manufactured and sold by M-Systems Flash Disk Pioneers, where there is a NAND controller 116 packaged inside the UFD and interacting using a device side NAND interface 124 with the NAND device 120A on one side and with the host processor 112B on the other side (using a host side USB interface 122 which uses the USB protocol). In a system built using this architecture the host processor typically interacts with the NAND controller using a standard protocol such as USB or ATA, as the interaction is external to the processor and it is more convenient to use standard protocols that are already supported by the processor for other purposes.

Note that according to the terminology previously defined, NAND interface 124 is a "flash memory device side NAND interface" (i.e. adapted to interact with NAND flash device 120A) but at the same time NAND interface 124 is also a host-type NAND interface (i.e. adapted to initiate the NAND protocol interaction).

A third prior art approach is shown in FIG. 4. Here the NAND controller 118 is physically located within the NAND device 120B. The flash device and the controller may even be implemented on the same die. This is for example the case in some of the MDOC storages devices manufactured and sold by M-Systems Flash Disk Pioneers and in the OneNAND devices manufactured and sold by Samsung Electronics. In a system built using this architecture the host processor 112B typically interacts with the NAND controller using either a standard protocol such as USB or a semi-standard protocol as is the case in the MDOC and OneNAND examples mentioned above.

We can deduce from the above that a prior art stand-alone NAND controller (that is not integrated with neither the NAND device nor the host processor) will typically have some standard interface on its host side, and a NAND interface on its flash memory device side (for example, see FIG. 3B). Indeed one can find in the market NAND controllers exporting many interface types—USB, SD (SecureDigital), MMC (MultiMediaCard), and more. However, one cannot currently find a stand-alone NAND controller that exports NAND interface to the host. Indeed, this is reasonable to expect—a host processor that does not have built-in NAND support and requires an external controller for that purpose, typically does not have a NAND interface and cannot directly connect to a device exporting a NAND interface and therefore has no use of a controller with host-side NAND interface. On the other hand, a host processor that has built-in NAND support typically also includes a built-in NAND controller and can connect directly to a NAND device, and therefore has no need for an external NAND controller.

The prior art described above leaves one problem unsolved. Assume that there is a host processor incorporating a built-in NAND controller and a NAND interface as in FIG. 2. The built-in controller is designed to work with NAND devices of a certain level of reliability. This is so because a NAND controller provides a certain level of error detection and correction, and therefore cannot support NAND devices with lower reliability. For example, a NAND controller having a 1-bit ECC can work with SBC NAND devices that are specified by their manufacturers to require only this level of error correction. Such controller cannot work with two-bit-per-cell MBC NAND devices because they require 4-bit ECC, and therefore some data might not be read correctly into the processor. Similarly, a NAND controller providing 4-bit ECC can work with current two-bit-per-cell MBC NAND, but will not work with next generation MBC NAND devices that will most probably require a higher level of ECC capability.

This is so because future MBC NAND devices are expected to be less reliable than current MBC devices and to require a much stronger ECC capability. The reasons for the reduced reliability and increased error rate are twofold:

a. The process used for manufacturing NAND devices is continuously being improved to yield smaller memory cells. While a few years ago NAND devices used 0.4 micron process, currently they use 90 nm and 70 nm technology, and this shrinking trend is expected to continue. With shrinking dimensions of the memory cells comes lower reliability, as the small dimensions make the cells more sensitive to physical effects and phenomena that previously were not important.

b. When MBC cells with more than two bits per cell will become commercially available, they will necessarily be much less reliable than SBC cells and two-bit-per-cell MBC cells. The larger number of states that have to be represented by the cell's threshold voltage imply that the margins between states are smaller and even smaller disturbances and drifts result in incorrect reading of data. This effect could already be witnessed in the comparison between SLC and two-bit-per-cell MBC, where the ECC requirements increased from 1-bit ECC to 4-bit ECC.

Returning now to the host processor 112A with the built-in NAND controller 114, suppose the controller 114 supports only 1-bit ECC. Then this processor might not be able to use MBC NAND even though this is highly desirable because of the MBC NAND lower cost. If the MBC NAND is connected to the NAND interface of the built-in controller of the processor, which might be the only way to connect it to the processor, then the MBC NAND generates too many errors for the limited-capability ECC of the built-in controller to correct.

Similarly, if the built-in controller supports 4-bit ECC, it can use both SLC and two-bit-per-cell MBC NAND. But when NAND devices with lower reliability appear in the market, the processor is not able to benefit from their lower price because its built-in controller is not able to provide the required level of error correction.

Therefore we see that the state of the prior art does not provide a good solution to the problem of benefiting from the cost advantage of a new NAND device, while using a host processor incorporating a built-in NAND controller designed to support a previous generation of NAND devices.

There is an ongoing need for devices and methods that provide compatibility between a host device having an onboard NAND controller and successive generations of NAND flash memory devices.

SUMMARY OF THE INVENTION

The aforementioned needs are satisfied by several aspects of the present invention.

It is disclosed a controller for interfacing between a host device and a flash memory device (e.g. a NAND flash memory device) fabricated on a flash die. The presently disclosed controller includes (a) electronic circuitry fabricated on a controller die, the controller die being distinct from the flash die, (b) a first interface (for example, a host-type interface) for interfacing between the electronic circuitry and the flash memory device (e.g. the NAND flash memory device), and (c) a second interface (for example, a flash-type interface) for interfacing between the controller and the host device, wherein the second interface is a NAND interface.

According to some embodiments, the first interface is an inter-die interface.

According to some embodiments, the first interface is a NAND interface.

According to some embodiments, the presently disclosed controller further includes (d) an error correction module for providing error correction for data received through one of the first and second interface.

According to some embodiments, the presently disclosed controller further includes (d) at least one additional host-side interface for interfacing with the host device.

It is disclosed a data storage system including (a) a flash memory device fabricated on a flash die, and (b) the presently disclosed NAND controller, where the controller is operative to communicate with the flash memory device through the first interface.

According to some embodiments, the presently disclosed system further includes (c) a common packaging, wherein the flash memory device and the controller are both provided within the common packaging.

According to some embodiments, the presently disclosed system further includes (c) separate respective packagings, wherein each of the flash memory device and the controller is provided within a respective packaging.

According to some embodiments, the presently disclosed system further includes (c) a printed circuit board on which the flash memory device and the controller are mounted, wherein the flash die is directly mounted on the printed circuit board without a package.

According to some embodiments, the presently disclosed system further includes (c) a printed circuit board on which the flash memory device and the controller are mounted, wherein the controller die is directly mounted on the printed circuit board without a package.

It is disclosed a data storage system including (a) a host device, (b) a flash memory device fabricated on a flash die, and (c) the presently disclosed NAND controller operative to communicate with both the flash memory device through the first interface and with the host device through the second interface.

It is disclosed a method of writing data from a host device including the steps of: (a) providing a flash memory device fabricated on a flash die and a controller fabricated on a controller die, the flash die being distinct from the controller die, (b) issuing a write command from the host device to the controller according to a NAND interface protocol, and (c) issuing a write command from the controller to the flash memory device according to a NAND interface protocol.

According to some embodiments, the presently disclosed method further includes the step of (d) calculating parity bits by the controller.

It is disclosed a method of reading data to a host device including the steps of: (a) providing a flash memory device fabricated on a flash die and a controller fabricated on a controller die, the flash die being distinct from the controller die, (b) issuing a read command from the host device to the controller according to a NAND interface protocol, and (c) issuing a read command from the controller to the flash memory device according to a NAND interface protocol.

According to some embodiments, the presently disclosed method further includes the steps of (d) retrieving the data from the flash memory device to the controller, (e) retrieving parity bits associated with the retrieved data from the flash memory device to the controller, (f) correcting the retrieved data according to the retrieved parity bits, thereby generating corrected data, and (g) retrieving the corrected data from the controller to the host device.

It is disclosed a method of creating a data storage system including the steps of (a) providing a flash memory device fabricated on a flash die, (b) providing the presently disclosed NAND controller, and (c) deploying the flash controller to the flash memory device such that the flash controller is operative to communicate with the flash memory device through the first interface.

According to some embodiments, the presently disclosed method further includes the step of (d) packaging the flash controller and the flash memory device within a single package.

According to some embodiments, the flash memory device and the flash controller reside within separate respective packages, and the deploying includes engaging the respective packages to each other.

According to some embodiments, the presently disclosed method further includes the step of (d) mounting the flash memory device and the controller onto a printed circuit board, wherein the mounting includes directly mounting the flash memory die onto the printed circuit board without a package.

According to some embodiments, the presently disclosed method further includes the step of (d) mounting the flash memory device and the controller onto a printed circuit board, wherein the mounting includes directly mounting the controller die onto the printed circuit board without a package.

According to some embodiments, the presently disclosed method further includes the step of (d) deploying the data storage system to a host device such that the flash controller is operative to communicate with the host device through the second interface.

These and further embodiments will be apparent from the detailed description and examples that follow.

BRIEF DESCRIPTION OF THE DRAWINGS

FIG. 2 provides a block diagram of a prior art system including a host device and a NAND flash device.

DETAILED DESCRIPTION OF THE INVENTION

The present invention will now be described in terms of specific, example embodiments. It is to be understood that the invention is not limited to the example embodiments disclosed. It should also be understood that not every feature of the controllers, systems including controllers, and methods of reading and data described is necessary to implement the invention as claimed in any particular one of the appended claims. Various elements and features of devices are described to fully enable the invention. It should also be understood that throughout this disclosure, where a process or method is shown or described, the steps of the method may be performed in any order or simultaneously, unless it is clear from the context that one step depends on another being performed first.

U.S. patent application Ser. No. 11/326,336 (now U.S. Patent Application Publication No. US 2007/0074093 A1), which is hereby incorporated by reference, disclosed for the first time a new type of NAND controller, characterized by the fact that the interface it exports to the host side is a NAND interface. In some embodiments, this presently disclosed controller has NAND interfaces on both sides—on the flash memory device side, where the controller plays the role of a host towards the NAND device, and on the host device side, where the controller plays the role of a NAND device towards the host.

For the purposes of this disclosure, a "NAND flash memory device" is defined as electronic circuitry including a plurality of NAND flash memory cells and any necessary control circuitry (e.g. circuitry for providing a flash-type interface) for storing data within the NAND flash memory cells. It is noted that the "NAND flash memory device" does not necessarily have its own dedicated housing, and may reside with another "device" such as a controller within a single housing. In some embodiments, the "NAND flash memory device" is directly mounted onto a printed circuit board without any packing.

Furthermore, in some embodiments, the controller includes an error correction capability that is sufficient for correcting the many errors of a lower-reliability NAND device. Because these errors are corrected by the controller, the controller can present to the host a flash device having no errors at all, or having a smaller number of errors—small enough for the error correction capability of the host's built-in NAND controller to handle.

Figure 1A:
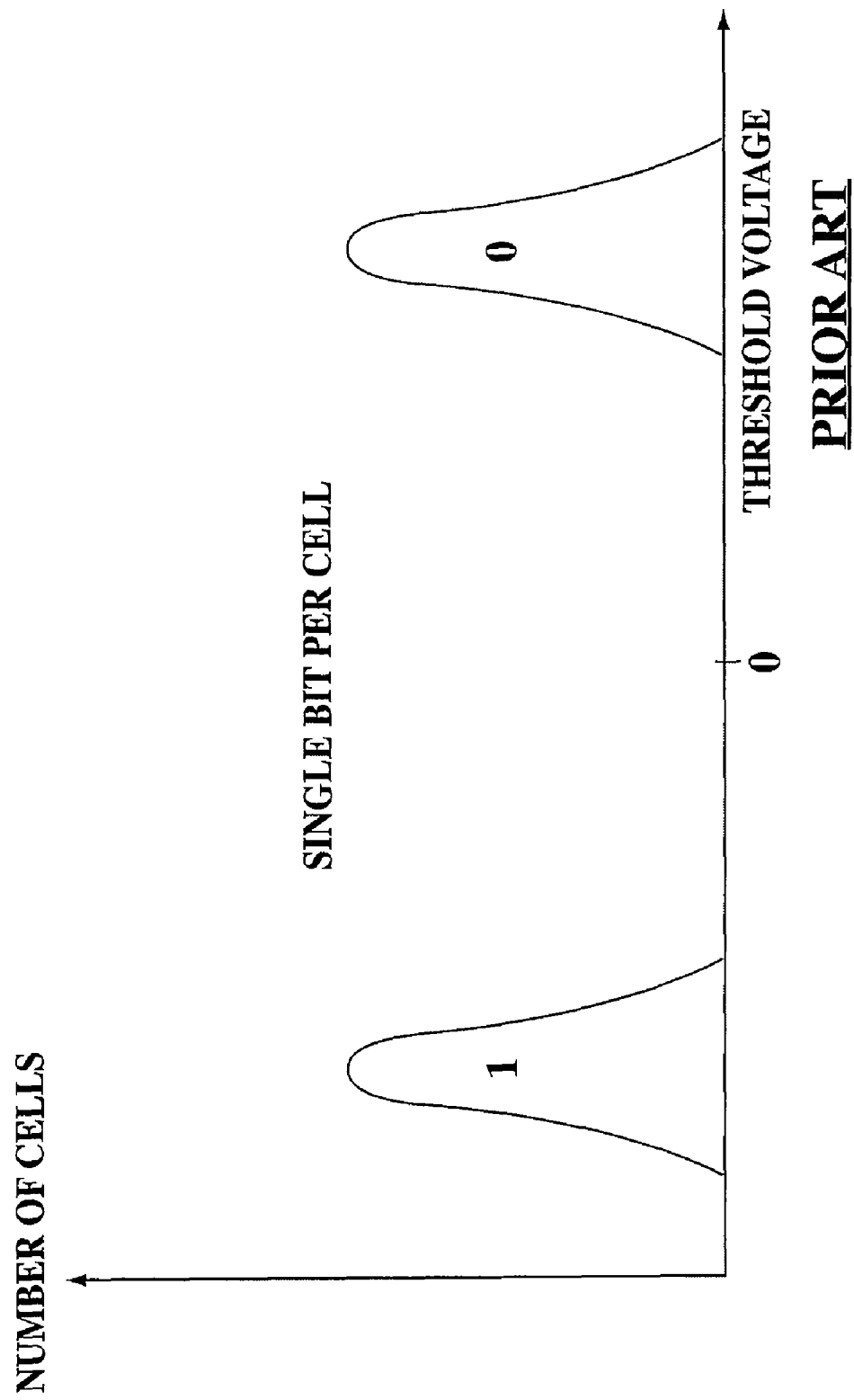
FIGS. 1A-1B provide a graphical illustration of distributions of thresholds voltages of a large population of memory cells (prior art).
Figure 1B:
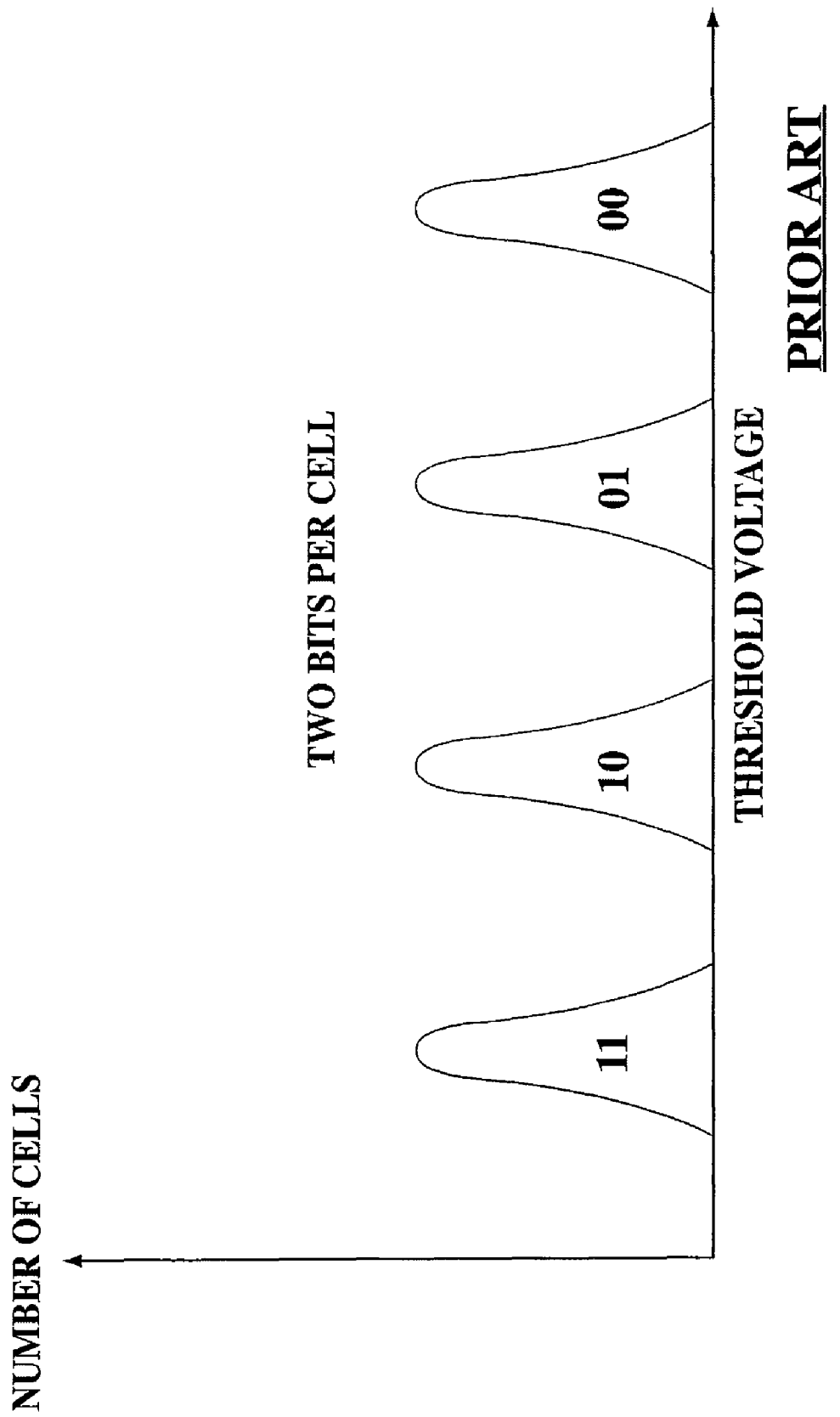
Figure 3A:
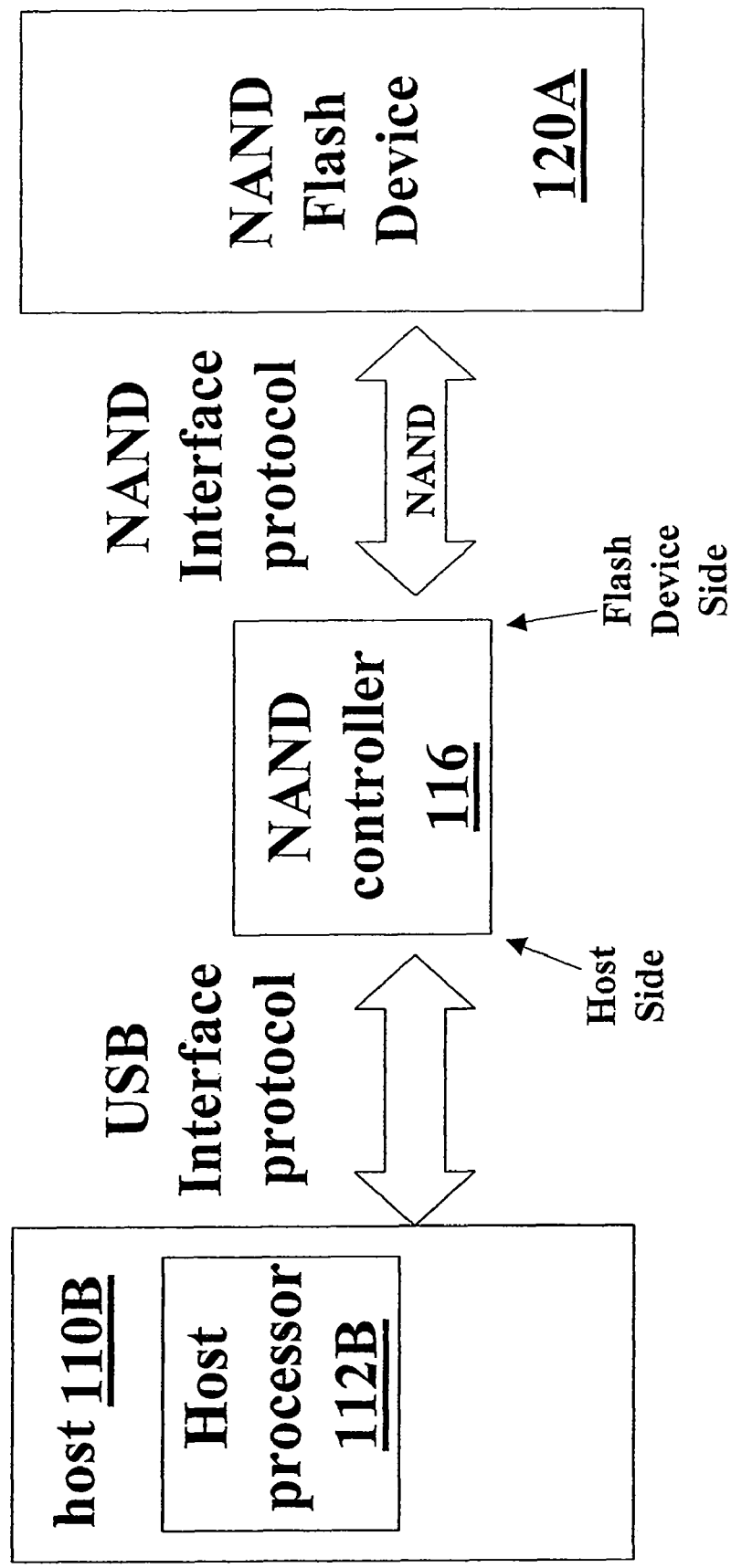
FIG. 3A provides a block diagram of a prior art system including a host device, a NAND controller and a NAND flash device.
Figure 3B:
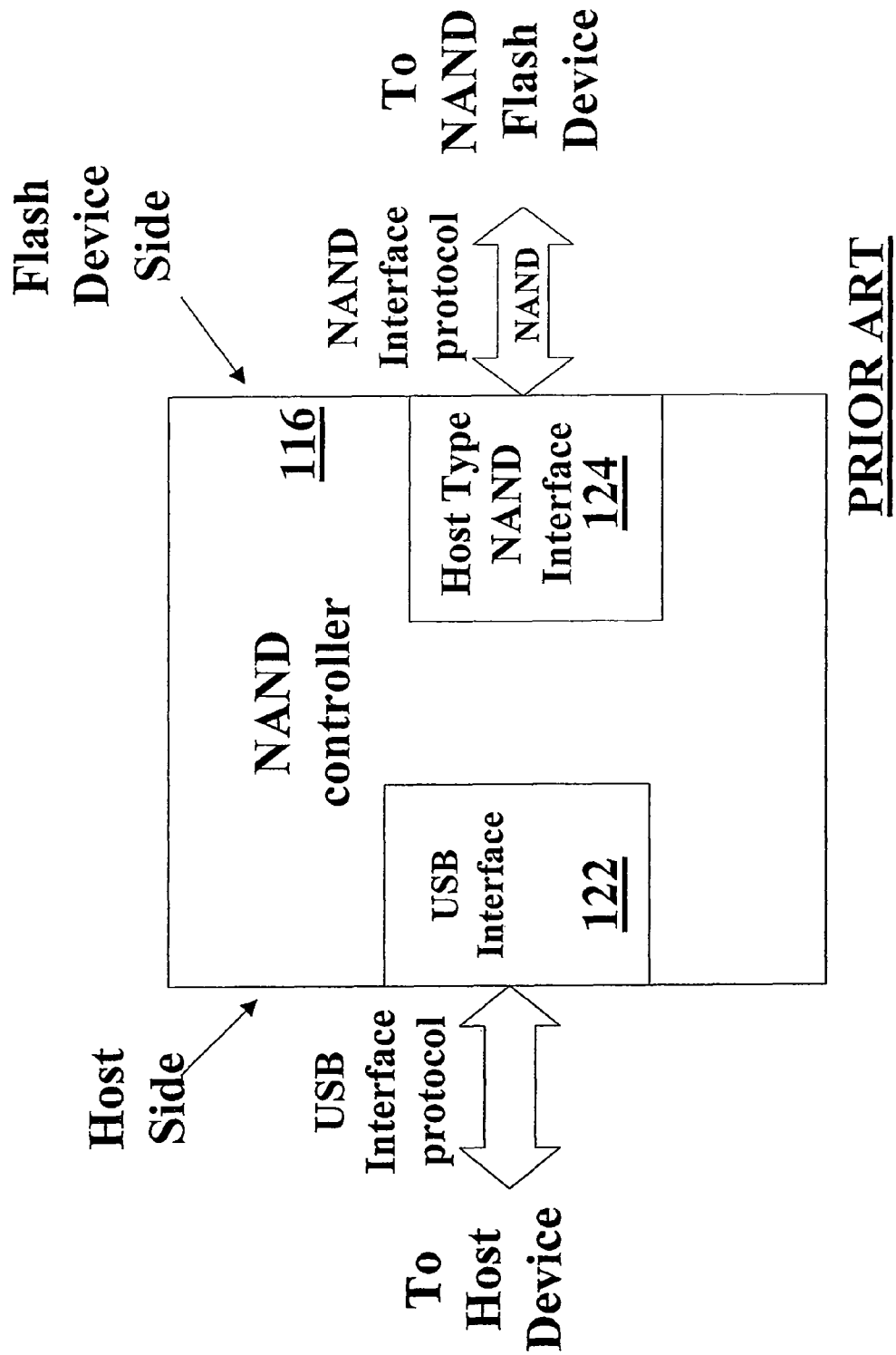
FIG. 3B provides a block diagram of a prior art NAND controller having a USB interface on the host side and a NAND interface on the flash memory device side.
Figure 4:
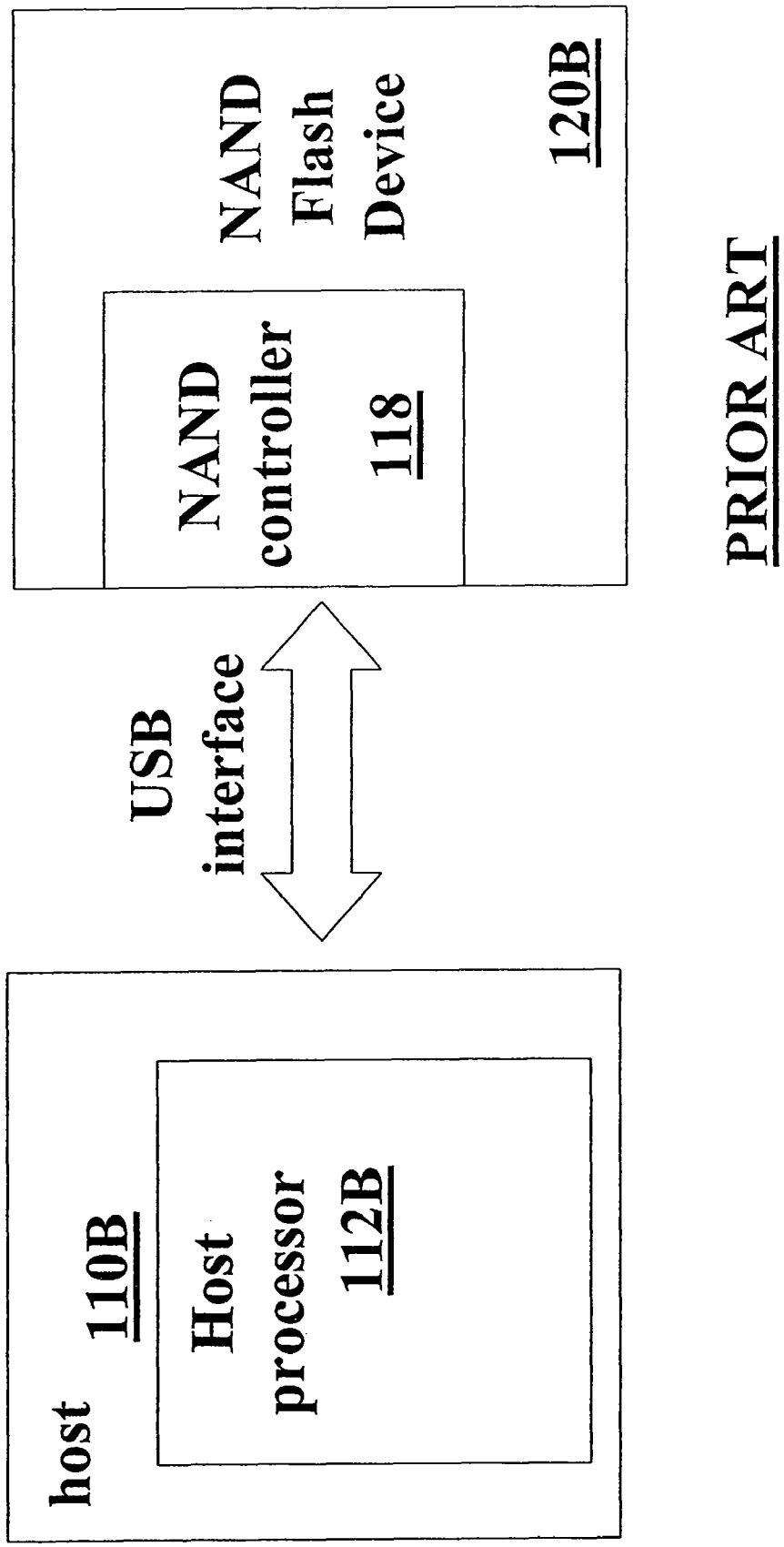
FIG. 4 provides a block diagram of a prior art system including a host device and a NAND flash device.
Figure 5A:
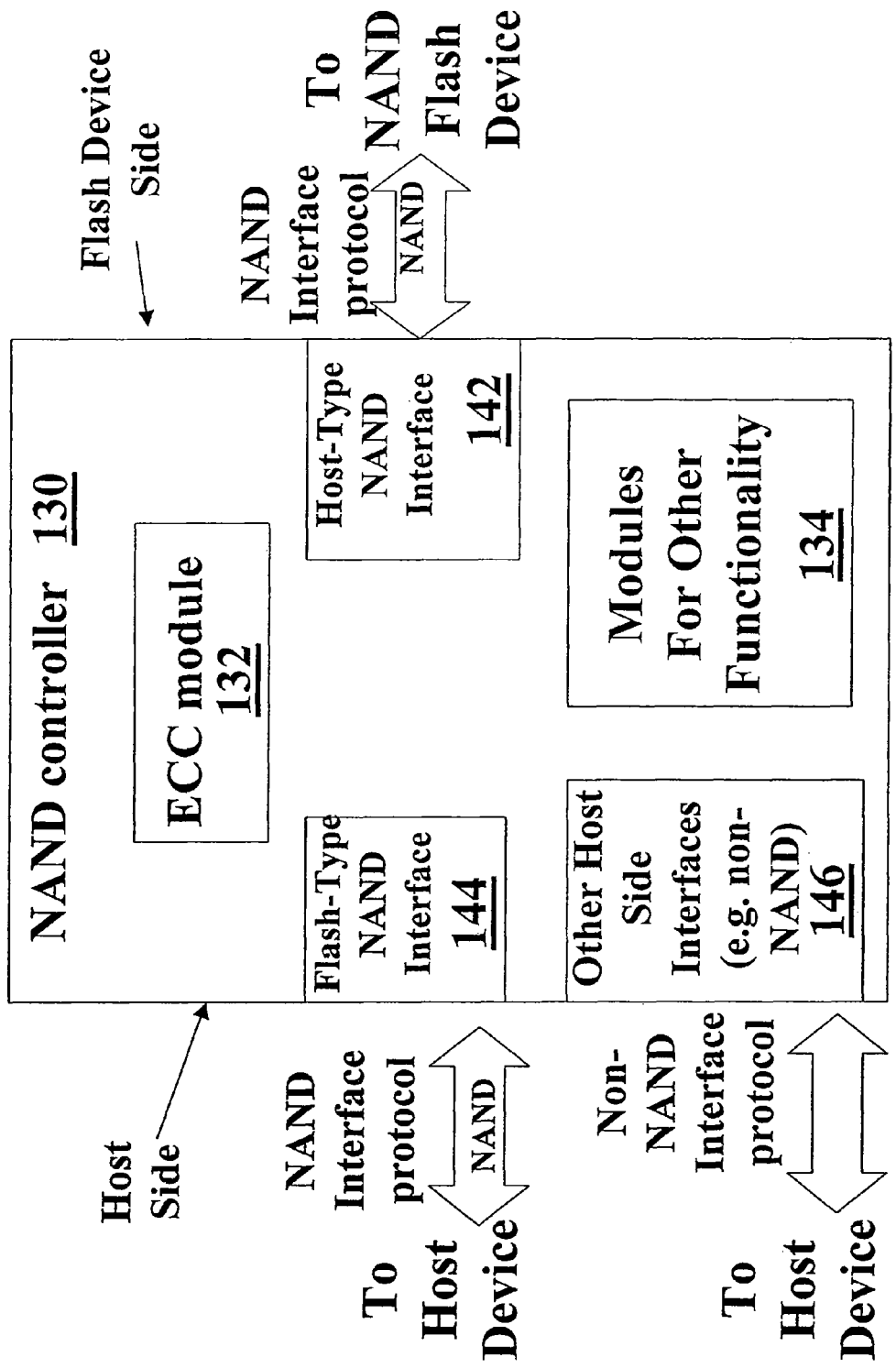
FIG. 5A provides a block diagram of a NAND controller having a NAND interface on the host side and a NAND interface on the flash memory device side in accordance with exemplary embodiments of the present invention.

Attention is now called to FIG. 5A, which provides a schematic block diagram of a controller in accordance with some embodiments of the present invention. Controller 130 includes a flash memory device-side NAND interface 142 for interfacing to a NAND flash device. Furthermore, it is noted that flash memory device-side NAND interface 142 is also a host-type NAND interface (i.e. adapted to initiate the interaction over the NAND interface, and to present a host device to a NAND flash device).

The controller 130 also includes a host side NAND interface 144 for interfacing to a host that supports a NAND interface protocol. This host side NAND interface is also a flash memory-type NAND interface (e.g. the controller 130 is adapted to present to the host a NAND flash memory storage device). The controller may optionally include one or more additional host-side interfaces 146, for interfacing the controller to hosts using non-NAND interfaces, such as USB or MMC interfaces.

As shown in FIG. 5A, the controller further includes an ECC module 132 for detecting and correcting all or some of the errors in the data retrieved from the NAND device through device-side interface 142. The ECC module 132 may include hardware, software, firmware or any combination thereof. The ECC module 132 may correct all errors, in which case the NAND controller 130 exports to the host an error-free NAND device. Alternatively, the ECC module 132 may correct only some of the errors found in the data retrieved from the NAND device through the flash memory device-side NAND interface 142.

In one example, the NAND device may have a reliability that requires 4-bit ECC, and the ECC module 142 corrects enough of the errors to increase the data reliability up to the level that enables a 1-bit ECC module in the host's built-in NAND controller to handle the data.

It is noted that NAND controller 130 may optionally also include one or more modules 134 (e.g. including hardware, software, firmware or any combination thereof) for providing other functionality, such as encryption functionality or address mapping that maps logical flash addresses received from the host into physical flash addresses sent to the flash device. Examples of other types of additional functionality are discussed below.

Figure 5B:
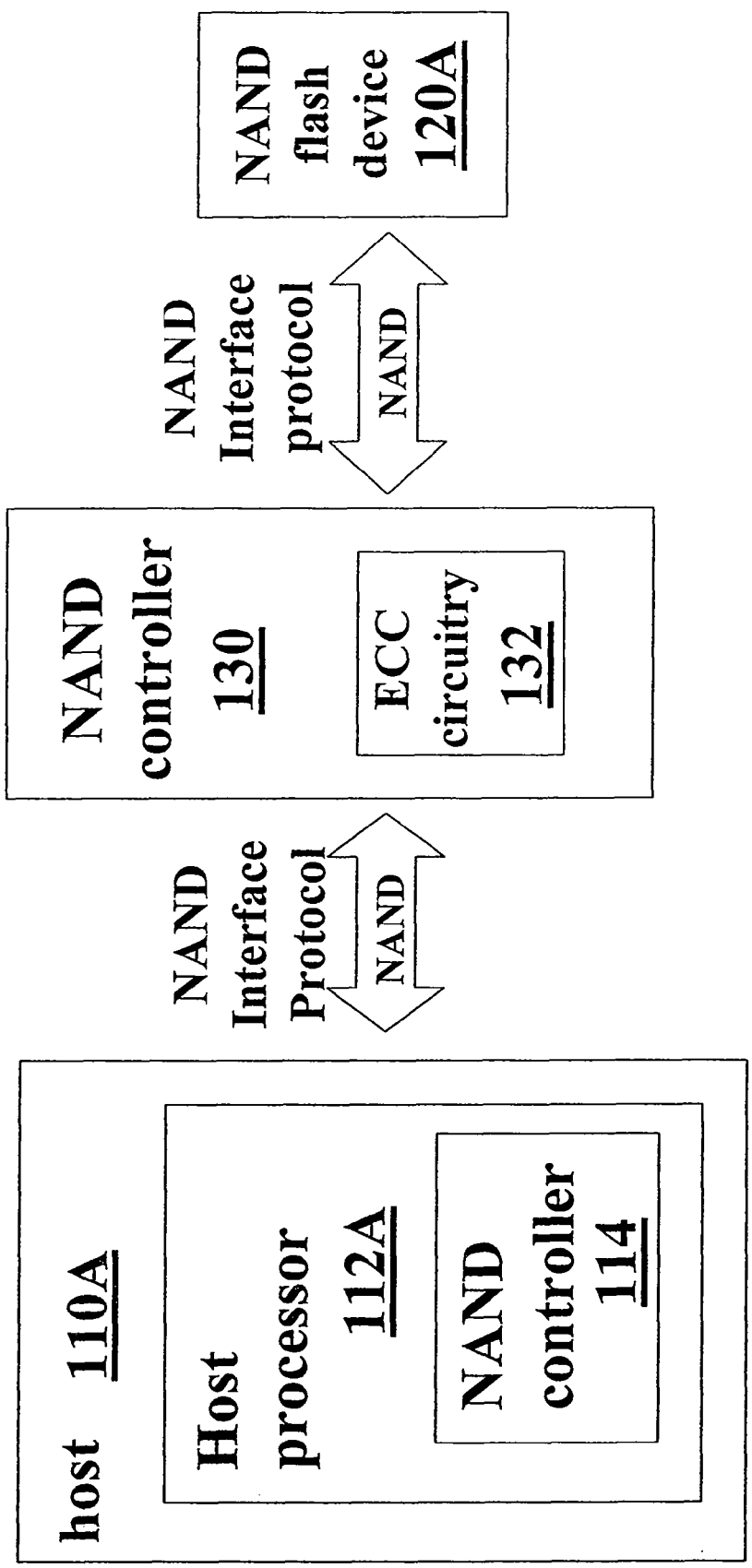
FIG. 5B provides a block diagram of a system including a host device, the NAND controller of FIG. 5A, and a NAND flash device in accordance with exemplary embodiments of the present invention.

Attention is now called to FIG. 5B which shows a schematic block diagram of an exemplary system including the external NAND controller 130 (e.g. a controller separate from the host device) described in FIG. 5A. Through device side NAND interface 142 the external NAND controller 130 interfaces with NAND flash device 120A. Through host side NAND interface 144, the NAND controller 130 interfaces with host device 110A.

One should note that the way external controller 130 interfaces through the two NAND interfaces 142 and 144 is not identical. The NAND interface protocol is not symmetrical— there is an initiator side that initiates the transactions ("host-type" according to the previously defined terminology) and there is a responding side that only responds to the initiating signals ("flash-type" according to the previously defined terminology).

Using device side NAND interface 142, external NAND controller 130 acts as the host-type part of the NAND interface protocol and the NAND device 130 acts as the flash-type part of the NAND interface protocol. Using host side interface 144, external controller 130 acts as the flash-type part of the NAND interface protocol and host 110A acts as the host-type part of the NAND interface protocol.

Figure 6A:
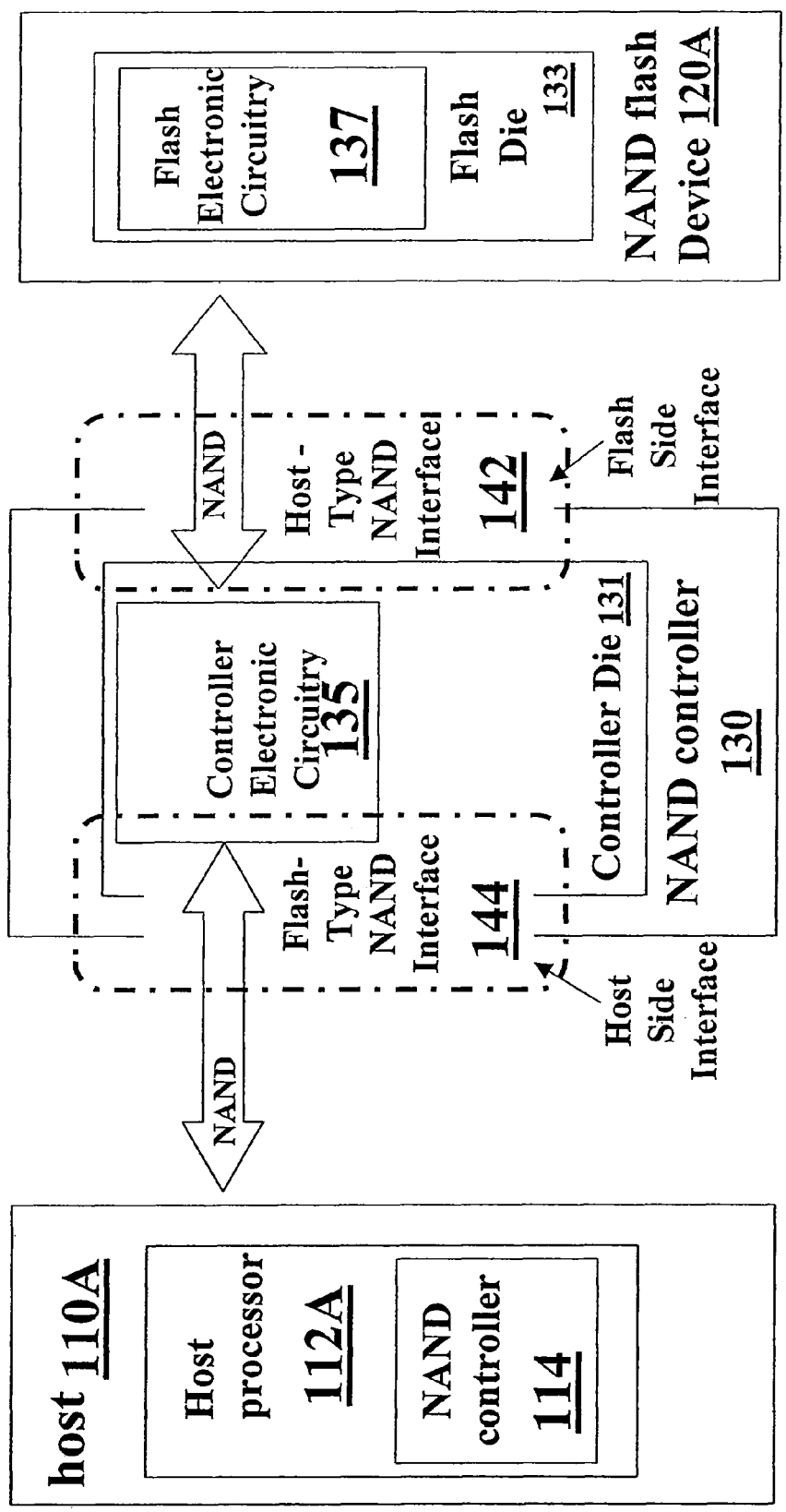
FIG. 6A illustrates an exemplary die configuration of the exemplary system described in FIG. 5B.

Attention is now called to FIG. 6A which shows an exemplary die configuration of the exemplary system described in FIG. 5A. Thus, it is noted that the NAND controller 130 includes electronic circuitry 135 fabricated on a controller die 131 while the NAND flash device 120A includes electronic circuitry 137 fabricated on a flash die 133. The controller die 131 and the flash die 133 are distinct dies.

It is noted that elements within the NAND controller 130 as described in FIG. 5A (i.e. the ECC module 132, the flash-type NAND interface 144, the host-type NAND interfaces) are implemented at least in part by the controller electronic circuitry 135 residing on the controller die.

The interface 142 between the controller electronic circuitry 135 and the flash electronic circuitry 137 is an "inter-die" interface. As used herein, an "inter-die interface" (e.g. an inter-die NAND interface) is operative to interface between two distinct units of electronic circuitry residing on distinct dies (e.g. to provide the necessary physical and logical infrastructure for the distinct units of electronic circuitry to communicate with each other, for example, using one or more specific protocols). Thus, the inter-die interface includes the necessary physical elements (pads, output and input drivers, etc) for interfacing between the two distinct units of electronic circuitry residing on separate dies.

According to some embodiments, an inter-die interface may interface between electronic circuitry fabricated on two distinct dies that are packaged in a common package. This example is illustrated in FIG. 6B, wherein both the NAND controller 130 and the NAND flash device 120A reside within a common multi-chip package 139.

Alternatively, the inter-die interface may interface between electronic circuitry fabricated on two distinct dies packaged in distinct packages (for example, where each die is packaged in its own package). This example is illustrated in FIG. 6C, wherein the NAND controller 130 and the NAND flash device 120A reside in separate respective packages. In particular, the NAND controller 130 resides within controller package 141, while the NAND flash device 120A resides within flash package 143. Thus, as illustrated in FIG. 6C, interface 142 is an "inter-package interface."

Figure 6B:
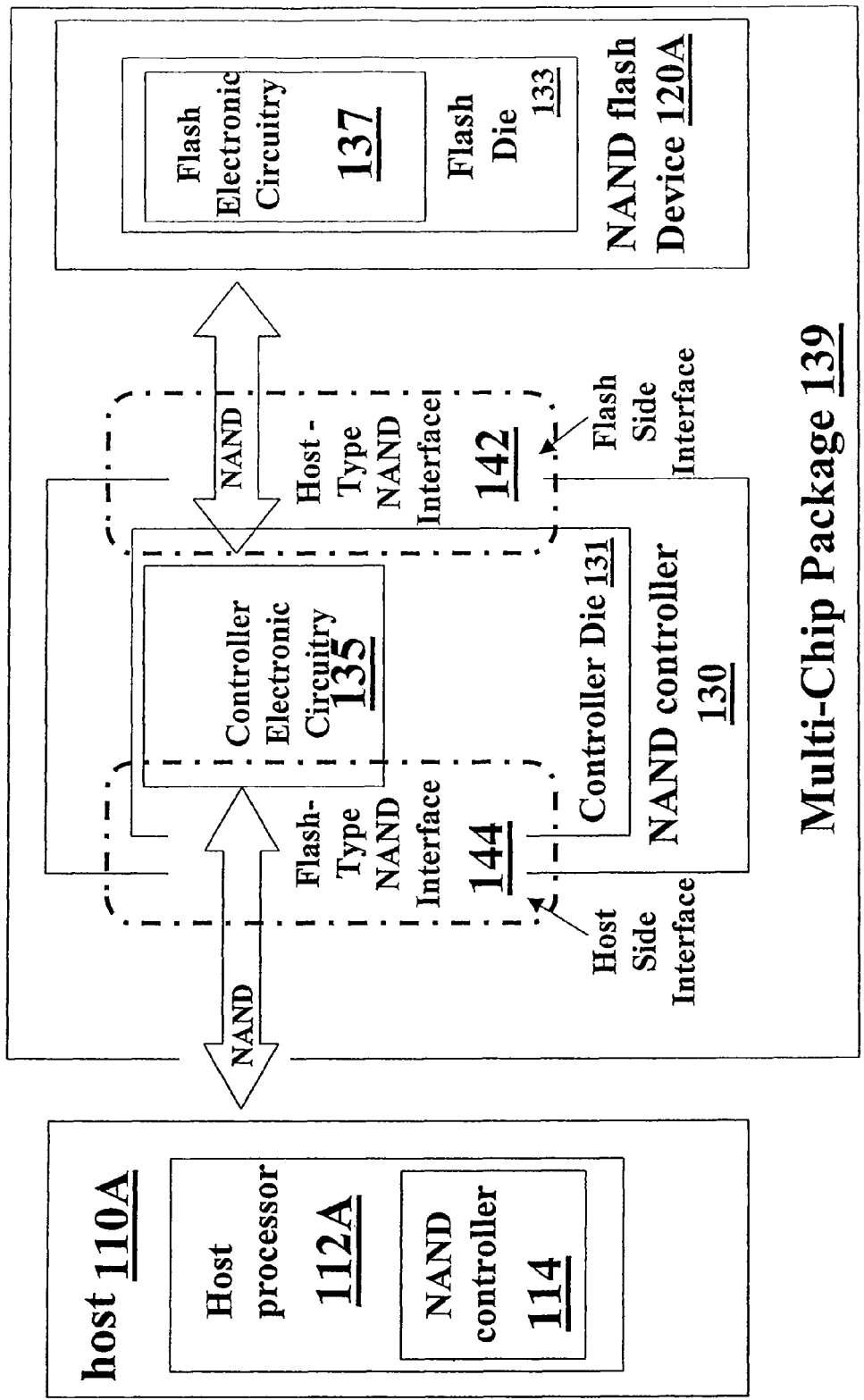
FIG. 6B illustrates an exemplary configuration of the exemplary system described in FIG. 5B where the NAND controller and the NAND flash device reside within a single multi-chip package.
Figure 6C:
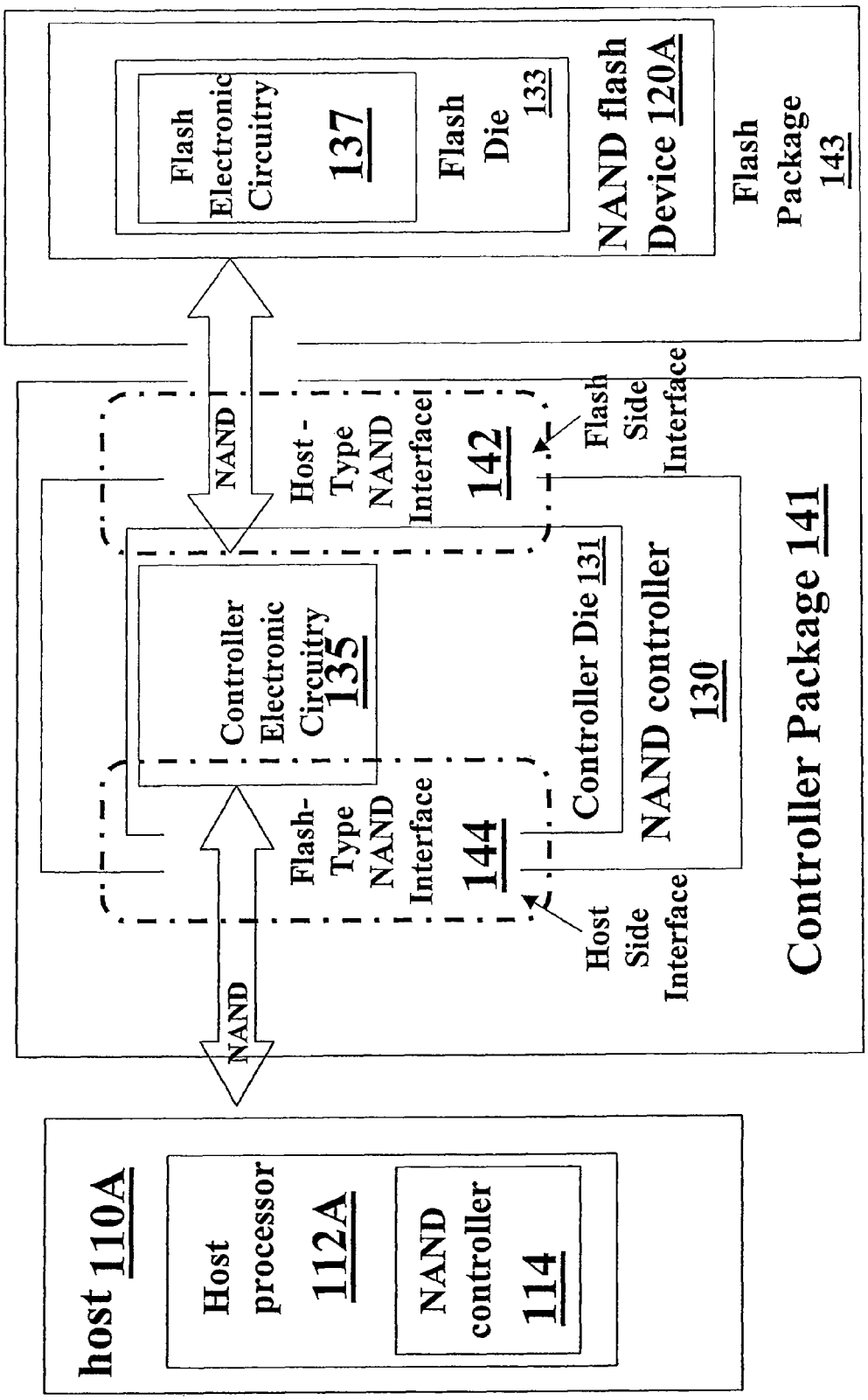
FIG. 6C illustrates an exemplary configuration of the exemplary system described in FIG. 5B where the NAND controller and the NAND flash device reside within separate respective packages.

It is noted that the examples where the dies reside in a common package (for example, as shown in FIG. 6A) and where the dies reside in separate packages (for example, as shown in FIG. 6B) are not the only possible configurations.

Thus, alternatively, in some embodiments, the inter-die interface may interface between electronic circuitry fabricated on two distinct dies, where one or both of these dies has no package at all. For example, in many applications, due to a need to conserve space, memory dies are provided (e.g. mounted, for example, directly mounted) on boards with no packaging at all. Thus, in one example, it is noted that in the new generation of memory cards for phones, memory dies are often mounted on boards with no packaging at all. As used herein, a die which is "directly mounted" onto a printed circuit board is mounted on the printed circuit board without being packaged first.

Figure 7:
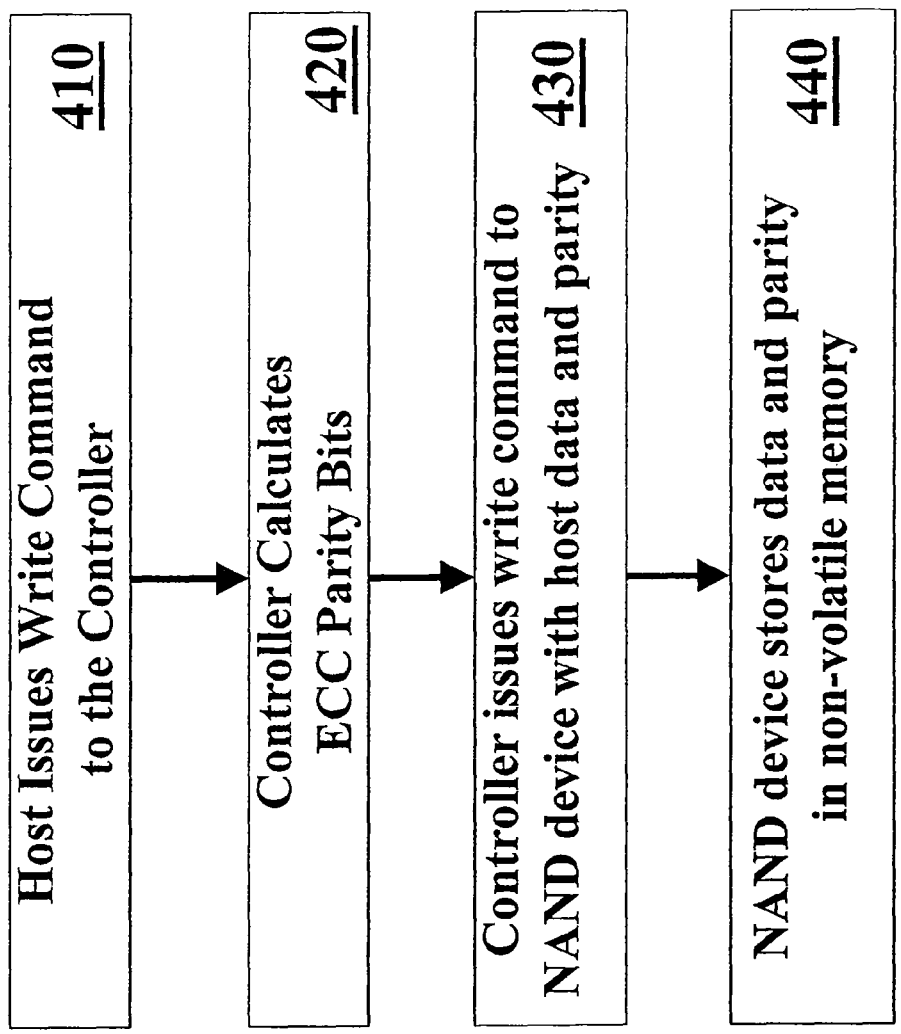
FIG. 7 shows a flow chart describing a method wherein a host writes data to a NAND storage device via an external NAND controller.

FIG. 7 shows a flow chart describing a method wherein a host 110A (e.g. a host including a NAND controller 114 within the device) writes data (e.g. a page of data) to a NAND storage device 120A via an external NAND controller 130. As shown in FIG. 7, the host 110A issues 410 a write command to the external controller 130 (e.g. a write command issued using the NAND interface protocol, including command bytes, address bytes and data bytes). The host 110A is not necessarily aware of the fact it is issuing the command to a controller 130, and may assume it is interfacing with a standard NAND flash storage device of the type it is capable of handling.

The NAND controller 130 receives the write command issued by the host (e.g. via the host-side NAND interface 144). After receiving the write command, the controller calculates ECC parity bits 420 (e.g. using ECC module 132) corresponding to the data bytes, and issues 430 a write command to the NAND device (e.g. via the flash memory device side interface 142). Again, the command is issued according to the NAND interface protocol, including command bytes, address bytes and data bytes that contain both the host's data bytes and the corresponding ECC parity bits. The NAND flash storage device is not necessarily aware that it received the command indirectly via the NAND controller 130 and not directly from the host device 110A. In step 440 the NAND flash storage device 120A stores the data bytes it received into the non-volatile memory cells, thus fulfilling the host's 110A request.

Figure 8:
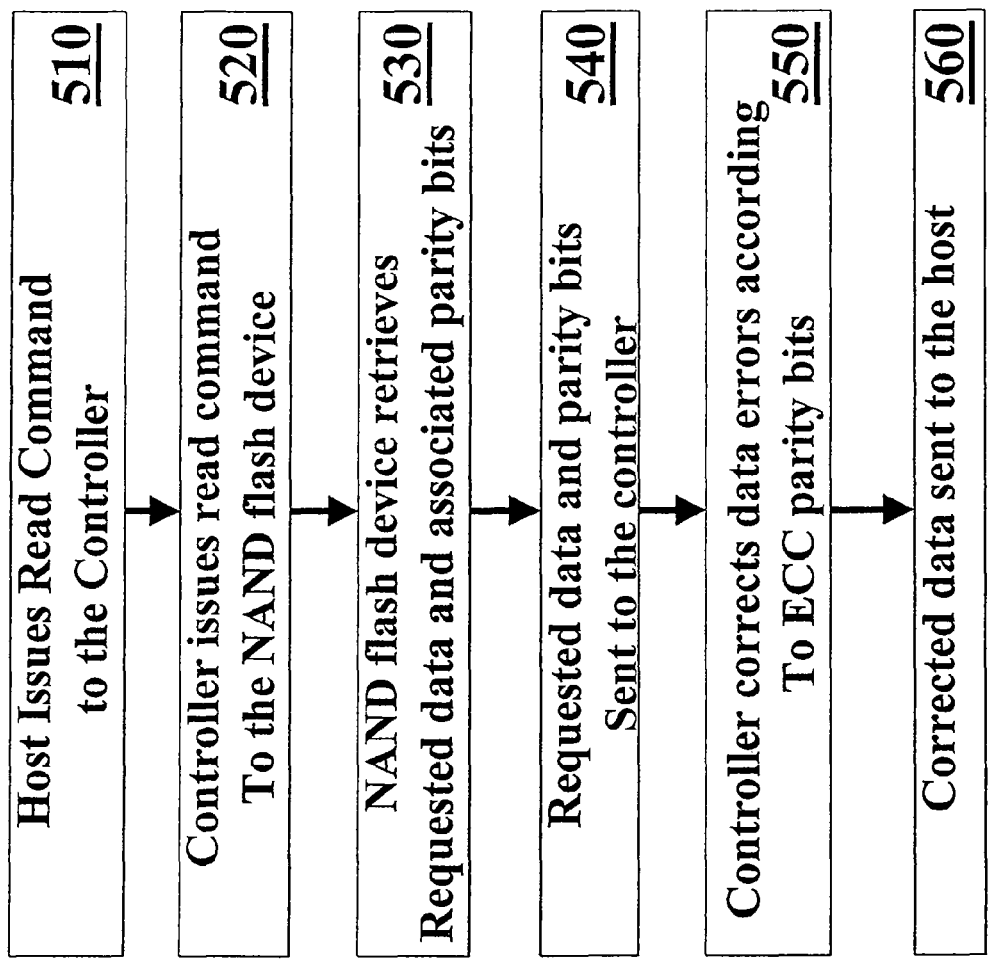
FIG. 8 shows a flowchart describing a method wherein a host reads data from a NAND storage device 120 via an external NAND controller.

FIG. 8 shows a flowchart describing a method wherein a host 110A (e.g. a host including a NAND controller 114 within the device) reads data (e.g. a page of data) from a NAND storage device 120A via an external NAND controller 130. Thus, the host 110A issues 410 a read command to the external controller 130 (e.g. a read command issued using the NAND interface protocol, including command bytes and address bytes). As in the write command above, the host 110A is not necessarily aware of the fact it is issuing the command to an external controller 130, and may assume it is interfacing with a standard NAND device of the type it is capable of handling.

The external NAND controller 130 receives the read command issued by the host (e.g. via the host-side NAND-interface 144). After receiving the read command, the external controller 130 issues 520 a read command (e.g. via the device-side NAND interface 142) to the NAND device 120A. Again, the command is issued according to the NAND interface protocol, including command bytes and address bytes. In step 530 the NAND flash storage device 120A retrieves the requested data from the non-volatile cells array, where the host data is accompanied by the ECC parity bits calculated when the data had been stored. In step 540 the data bytes and the accompanying parity bits are sent to the external NAND controller. This sending is done according to the NAND interface protocol by a series of read strobes generated by the controller, each sequentially reading into the controller one byte or one word (depending on whether the NAND interface used is 8 bits wide or 16 bits wide). In step 550 the external NAND controller 130 uses the parity bits for correcting errors in the data bytes (e.g. with the ECC module 132). In step 560 the corrected data bytes are sent to the host via the host side NAND interface 144. The sending is again done according to the NAND interface protocol by a series of read strobes generated by the host. The host 110A now has the same data bytes it originally stored into the flash memory.

It can now be seen that this invention allows one to benefit from the cost advantage of new NAND devices, while using a host processor incorporating a built-in NAND controller designed to support a previous generation of NAND devices.

As mentioned above, the NAND controller in these embodiments may include one or more modules (e.g. including hardware, software, firmware or any combination thereof) for providing other functionality, such as encryption functionality or address mapping that maps logical flash addresses received from the host into physical flash addresses sent to the flash device. The following sections provide examples of other types of additional functionality.

Exemplary NAND Flash Memory Controller Exporting a NAND Interface

Figure 9:
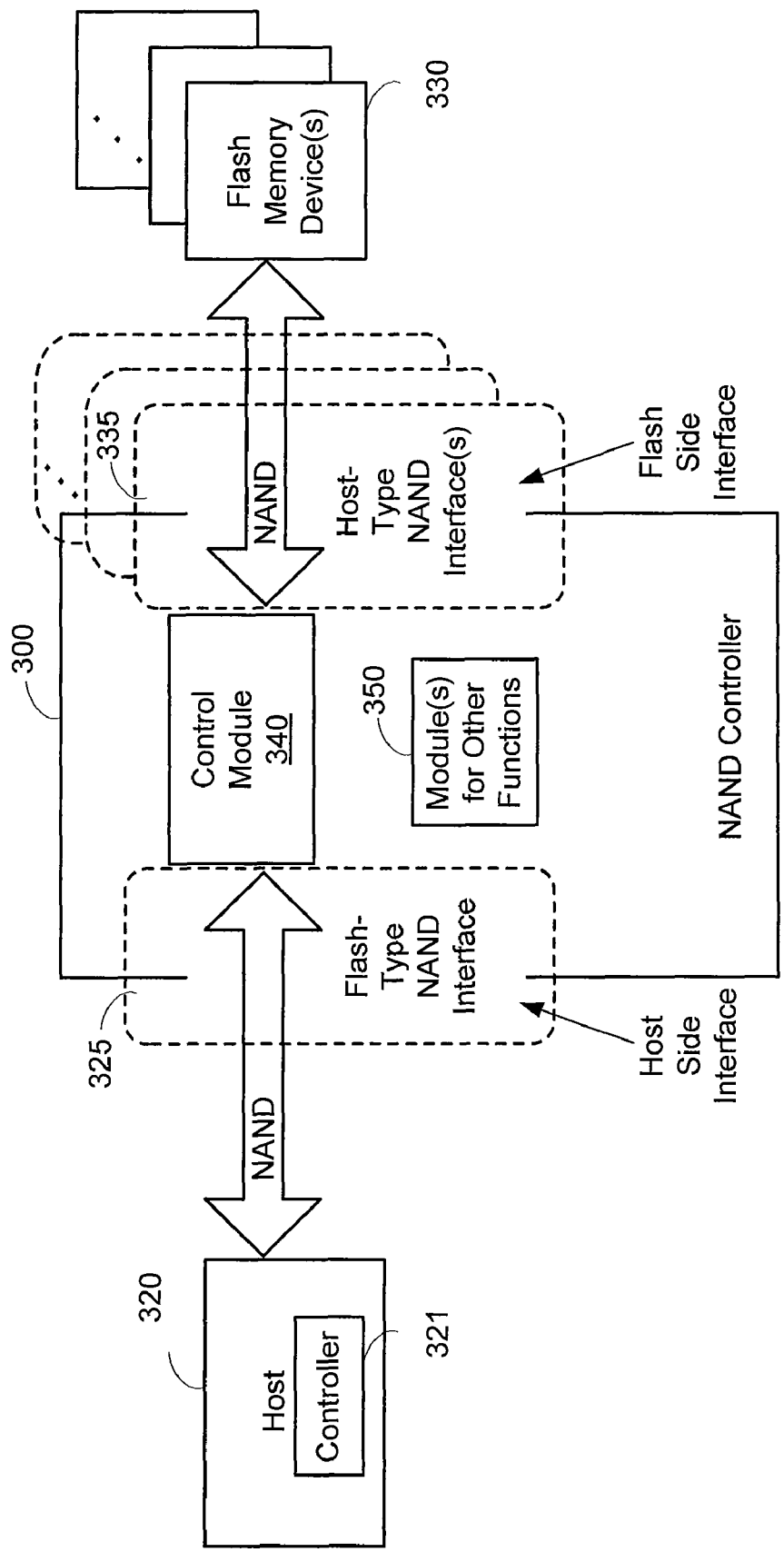
FIG. 9 is a block diagram of an exemplary controller of an embodiment.

Returning to the drawings, FIG. 9 is a block diagram of an exemplary controller 300 of an embodiment. As shown in FIG. 9, the controller 300 includes a control module 340 for controlling the operation of the controller 300 and, optionally, one or more additional modules 350 for providing other functions. Examples of other functions include, but are not limited to, data scrambling, column replacement, handling write aborts and/or program failures (via safe zones), read scrubbing, wear leveling, bad block and/or spare block management, error correction code (ECC) functionality, error detection code (EDC) functionality, status functionality, encryption functionality, error recovery, and address mapping (e.g., mapping of logical to physical blocks). The following paragraphs describe some of these functions, and the following section describe others of these functions.

"Data scrambling" or "scrambling" is an invertible transformation of an input bit sequence to an output bit sequence, such that each bit of the output bit sequence is a function of several bits of the input bit sequence and of an auxiliary bit sequence. The data stored in a flash memory device may be scrambled in order to reduce data pattern-dependent sensitivities, disturbance effects, or errors by creating more randomized data patterns. More information about data scrambling can be found in the following patent documents: U.S. patent application Ser. Nos. 11/808,906, 12/209,697, 12/251,820, 12/165,141, and 11/876,789, as well as PCT application no. PCT/US08/88625.

"Column replacement" refers to various implementations of mapping or replacing entirely bad columns, portions of columns, or even individual cells. Suitable types of column replacement techniques can be found in U.S. Pat. Nos. 7,379,330 and 7,447,066.

There are several potential problems in writing to flash memory devices where logically or physically adjacent data may be corrupted outside of the location where the data is attempted to be written. One example is when a write to one area (e.g., a cell, page, or block) of memory fails, and the contents of some surrounding memory may be corrupted. This is referred to as a "program failure" or "program disturb." A similar effect known as "write abort" is when a write (or program) operation is terminated prematurely, for example when power is removed unexpectedly. In both cases, there are algorithms which may be used to pro-actively copy data from a "risk zone" to a "safe zone" to handle write aborts and program failures, as described in U.S. Pat. No. 6,988,175.

"Read scrubbing" or, more generally, "scrubbing" refers to the techniques of refreshing and correcting data stored in a flash memory device to compensate for disturbs. A scrub operation entails reading data in areas that may have received exposure to potentially disturbing signals and performing some corrective action if this data is determined to have been disturbed. Read scrubbing is further described in U.S. Pat. Nos. 7,012,835, 7,224,607, and 7,477,547.

Flash memory devices may be written unevenly, and "wear leveling" refers to techniques that attempt to even out the number of times memory cells are written over their lifetime. Exemplary wear leveling techniques are described in U.S. Pat. Nos. 6,230,233 and 6,594,183.

In general, flash memory devices are manufactured with an excess number of blocks (greater than the defined minimum capacity). Either during factory testing or during use of the device, certain blocks may be discovered as "bad" or "defective," meaning that they are unable to correctly store data and need to be replaced. Similarly, there may be an excess of "good" blocks (greater than the defined minimum capacity) which may be used as "spares" until another block fails or becomes defective. Keeping track of these extra blocks is known as bad block management and spare block management, respectively. More information about bad block and spare block management can be found in U.S. Pat. No. 7,171,536.

As mentioned above, additional information about these different functional modules and how they are used in exemplary controller architectures is provided later in this document.

Returning to the drawings, as also shown in FIG. 9, the controller 300 includes one or more flash memory device-side NAND interface(s) 335 for interfacing with one or more NAND flash device(s) 330 (e.g., 1-8 memory dies). Furthermore, it is noted that the flash memory device-side NAND interface 335 is also a host-type NAND interface (i.e., that it is adapted to initiate the interaction over the NAND interface and to present a host to a NAND flash device(s) 330). The controller 300 also includes a host side NAND interface 325 for interfacing to a host 320 (having a host controller 321) that supports a NAND interface protocol. This host side NAND interface 325 is also a flash memory-type NAND interface (e.g., the controller 300 is adapted to present to the host 320 a NAND flash memory storage device). Examples of NAND interfaces include, but are not limited to, Open NAND Flash Interface (ONFI), toggle mode (TM), and a high-performance flash memory interface, such as the one described in U.S. Pat. No. 7,366,029, which is hereby incorporated by reference. The controller 300 may optionally include one or more additional host-side interfaces, for interfacing the controller 300 to hosts using non-NAND interfaces, such as SD, USB, SATA, or MMC interfaces. Also, the interfaces 325, 335 can use the same or different NAND interface protocols.

It should be noted that the controller 300 and flash memory device(s) 330 can be used in any desired system environment. For example, in one implementation, a product manufactured with one or more controller 300/flash memory device(s) 330 units is used in a solid-state drive (SSD). As another example, the controller 300 can be used in OEM designs that use a Southbridge controller to interface to flash memory devices.

There are several advantages of using a NAND flash memory controller that exports a NAND interface to a host. To appreciate these advantages, first consider the realities of current controller architectures. Today, there are two types of NAND interfaces: a "raw" interface and a "managed" interface. With a raw interface, the basic memory is exposed with primitive commands like read, program, and erase, and the external controller is expected to provide memory management functions, such as ECC, defect management, and flash translation. With a managed interface, through some higher level interface, logical items such as sectors/pages/blocks or files are managed, and the controller manages memory management functions.

However, the set of firmware required to "manage" the NAND can be divided into two categories. The first category is generic flash software that mostly manages the host interface, objects (and read/modify/write sequences), and caching. This is referred to as the "host management" layer. The second category is flash-specific management functionality that does, for example, the ECC, data scrambling, and specific error recovery and error prevention techniques like pro-active read scrubbing and copying lower-page blocks to prevent data loss due to write aborts, power failures, and write errors. This is referred to as the "device management" layer.

The first category of software is relatively constant and may be provided by various companies, including OS vendors, chipset and controller vendors, and embedded device vendors. In general, let's assume there are M specific systems/OSes/ASICs that may want to use flash in their designs. The second set is potentially proprietary to individual companies and even specific to certain memory designs and generations. In general, let's assume there are N different memory specific design points. Today, this is an all-or-nothing approach to flash management—either buy raw NAND or managed NAND. This also means that a solution must incorporate one of the M system and host management environments with one of the N memory device management environments. In general, this means that either (1) a flash vendor with the second kind of knowledge must provide all layers of a solution, including ASIC controller and host interface software, and do M different designs for the M different host opportunities, or (2) any independent ASIC and firmware company has little opportunity to customize their solutions to specific memory designs without doing N different designs, or (3) two companies have to work together, potentially exposing valuable trade secrets and IP and/or implement different solutions for each memory design. This can also produce a time-to-market delay if M different host solutions have to be modified to accept any new memory design or vice versa.

By using a NAND flash memory controller that exports a NAND interface to a host, a new logical interface is provided that uses existing physical NAND interfaces and commands, such as legacy asynchronous, ONFI, or TM, to create a new logical interface above raw or physical NAND and below logical or managed NAND, create "virtual" raw NAND memory with no ECC required in the host controller, and disable host ECC (since 0 ECC is required from the host to protect the NAND memory). This new logical interface also can provide, for example, data scrambling, scrubbing, disturbs, safe zone handling, wear leveling, and bad block management (to only expose the good blocks) "beneath" this interface level.

This different logical interface provides several advantages over standard flash interfaces or managed NAND interfaces, including ONFI Block Abstraction (BA) or Toshiba LBA. For example, separation of the memory-specific functions that may vary from memory type and generation (e.g., NAND vs. 3D (or NOR) and 5xnm vs. 4xnm vs. 3xnm) allows for different amounts of ECC, vendor-unique and memory-unique schemes for error prevention and correction schemes, such as handling disturbs and safe zones, and allows vendor-unique algorithms to remain "secret" within the controller and firmware. Additionally, there is greater commonality between technology (and vendors) at this logical interface level, which enables quicker time to market. Further, this allows much closer to 1:1 command operation, meaning improved and more-predictable performance versus managed NAND or other higher level interfaces.

There are additional advantages associated with this controller architecture. For example, it allows for independent development, test, and evolution of memory technology from the host and other parts of the system. It can also allow for easier and faster deployment of next generation memories, since changes to support those memories are more localized. Further, it allows memory manufactures to protect secret algorithms used to manage the raw flash. Also, page management can be integrated with the file system and/or other logical mapping. Thus, combined with standard external interfaces (electrical and command sets), this architecture makes it easier to design in raw flash that is more transparent from generation to generation.

There is at least one other secondary benefit from the use of this architecture—the controller 300 only presents a single electrical load on the external interface and drives the raw flash internal to the MCP. This allows for potentially greater system capacity without increasing the number of flash channels, higher speed external interfaces (since fewer loads), and higher-speed internal interfaces to the raw flash devices (since very tightly-controlled internal design (substrate connection) is possible).

Another advantage associated with the controller of this embodiment is that is can be used to provide a "split bus" architecture through the use of different host and memory buses, potentially at different speeds (i.e., the bus between the host and the controller can be different from the bus between the controller and the flash memory device(s)). (As used herein, a "bus" is an electrical connection of multiple devices (e.g., chips or dies) that have the same interface. For example, a point-to-point connection is a bus between two devices, but most interface standards support having multiple devices connected to the same electrical bus.) This architecture is especially desired in solid-state drives (SSDs) that can potentially have hundreds of flash memory devices. In conventional SSD architectures, the current solution is to package N normal flash memory devices in a multi-chip package (MCP), but this still creates N loads on a bus, creating N times the capacitance and inductance. The more loads on a bus, the slower it operates. For example, one current architecture can support a 80 MHz operation with 1-4 devices but can support only a 40 MHz operation with 8-16 devices. This is the opposite of what is desired—higher speeds if more devices are used. Furthermore, more devices imply the need for greater physical separation between the host and the memory MCPs. For example, if 16 packages were used, they will be spread over a relatively large physical distance (e.g., several inches) in an arbitrary topology (e.g., a bus or star-shaped (or arbitrary stub) topology). This also reduces the potential performance of any electrical interface. So, to obtain, for example, 300 MHz of transfers (ignoring bus widths), either four fast buses or eight slow buses can be used. But, the fast buses could only support four flash memory devices each, or 16 total devices, which is not enough for most SSDs today. If the buses run faster, the number of interface connections (pins and analog interfaces) can be reduced, as well as potentially the amount of registers and logic in the host.

Because the controller 300 in this embodiment splits the interconnection between the host and the raw flash memory device(s) into a separate host side interface and a flash side interface with a buffer in between, the host bus has fewer loads and can run two to four times faster. Further, since the memory bus is internal to the MCP, it can have lower power, higher speed, and lower voltage because of the short distance and finite loads involved. Further, the two buses can run at different frequencies and different widths (e.g., one side could use an 8-bit bus, and the other side can use a 16-bit bus).

While some architectures may insert standard transceivers to decouple these buses, the controller 300 of this embodiment can use buffering and can run these interfaces at different speeds. This allows the controller 300 to also match two different speed buses, for example, a flash side interface bus running at 140 MB/sec and an ONFI bus that runs at either 132 or 166 MB/sec. A conventional bus transceiver design would have to pick the lower of the two buses and run at 132 MB/sec in this example, while the controller 300 of this embodiment can achieve 140 MB/sec by running the ONFI bus at 166 MB/sec and essentially have idle periods. Accordingly, the controller 300 of this embodiment provides higher performance at potentially lower cost and/or lower power and interface flexibility between different products (e.g., different speed and width host and memory buses, fewer loads on the host in a typical system (which enables faster operation and aggregation of the memory bus bandwidth to the host interface), and different interfaces on the host and memory side with interface translation).

As mentioned above, a single controller can also have multiple flash side interface(s) 335 to the flash memory device(s), which also enables further parallelism between raw flash memory devices and transfers into the controller, which allows the flash side interface to run slower (as well as faster) than the host side interface 325. A single controller can also have multiple host side interfaces that may be connected to different host controller interfaces to allow for greater parallelism in accessing the flash memory device(s), to share the controller, or to better match the speed of the flash side interface (which could be faster than the host side interface for the reasons described above).

Another advantage of importing a NAND interface to a host relates to the use of a distributed controller architecture. Today, flash memory devices are typically implemented with a single level of controller. In large solid-state drives (SSDs), there may be tens or even hundreds of flash devices. In high-performance devices, it may be desirable to have parallel operations going on in as many of these flash devices as possible, which may be power constrained. There are interface specs today at 600 MB/sec, and these are still increasing. To reach this level of performance requires very fast controllers, memories, and ECC modules. Today, high performance controllers are built with either one or a small number of ECC modules and one or two microprocessors to handle memory device management. Since some of the functions are very localized to the memory devices themselves, such as ECC, with the controller 300 of this embodiment, a two-tiered network of devices can be utilized. Specifically, the host 320 can manage the host interface and high-level mapping of logical contents, and one or more controllers 300 can manage one or more raw NAND flash memory devices to provide local management of memory device functions (e.g., ECC) and parallelism in the execution of these functions due to parallel execution of the controller 300 and the host 320 and parallel execution of multiple controllers 300 handling different operations in parallel on different memories 320. In contrast to conventional controllers in SSDs, which perform memory device management functions in one place, by splitting these functions into two layers, this architecture can take advantage of parallel performance in two ways (e.g., between host and slave, and between many slaves). This enables higher total performance levels (e.g., 600 MB/sec) without having to design a single ECC module or microprocessor that can handle that rate.

Yet another advantage of this architecture is that a higher-level abstraction of the raw memory can be developed, such that system developers do not need to know about error recovery or the low-level details of the memory, such as ECC and data scrambling, since the controller 300 can be used to perform those functions in addition to handling memory-specific functions such as read, erase, and program disturbs, and safe zones. This level of support is referred to herein as "corrected" flash," which is logically in between raw flash and managed NAND. On the other hand, this architecture is not fully managed memory in the sense of page or block management at a logical level and may require the host to provide for logical-to-physical mapping of pages and blocks. However, the controller 300 can still present some flash memory management restrictions to the host and its firmware, such as: only full pages can be programmed, pages must be written in order within a block, and pages can only be written once before the entire block must be erased. Wear leveling of physical blocks to ensure that they are used approximately evenly can also be performed by the controller 300; however, the host 320 can be responsible for providing this function. Also, the controller 300 preferably presents the host 320 with full page read and write operations into pages and blocks of NAND. The characteristics of logical page size and block size will likely be the same as the underlying NAND (unless partial page operations are supported). The majority of the spare area in each physical page in the raw NAND will be used by the controller 300 for ECC and its metadata. The controller 300 can provide for a smaller number of spare bytes that the using system can utilize for metadata management.

Exemplary NAND Flash Memory Controller Embodiment

This section discusses an exemplary controller architecture and provides more details on some of the various functional modules discussed above. As noted above, a "module" can be implemented in any suitable manner, such as with hardware, software/firmware, or a combination thereof, and the functionality of a "module" can be performed by a single component or distributed among several components in the controller.

Figure 10A:
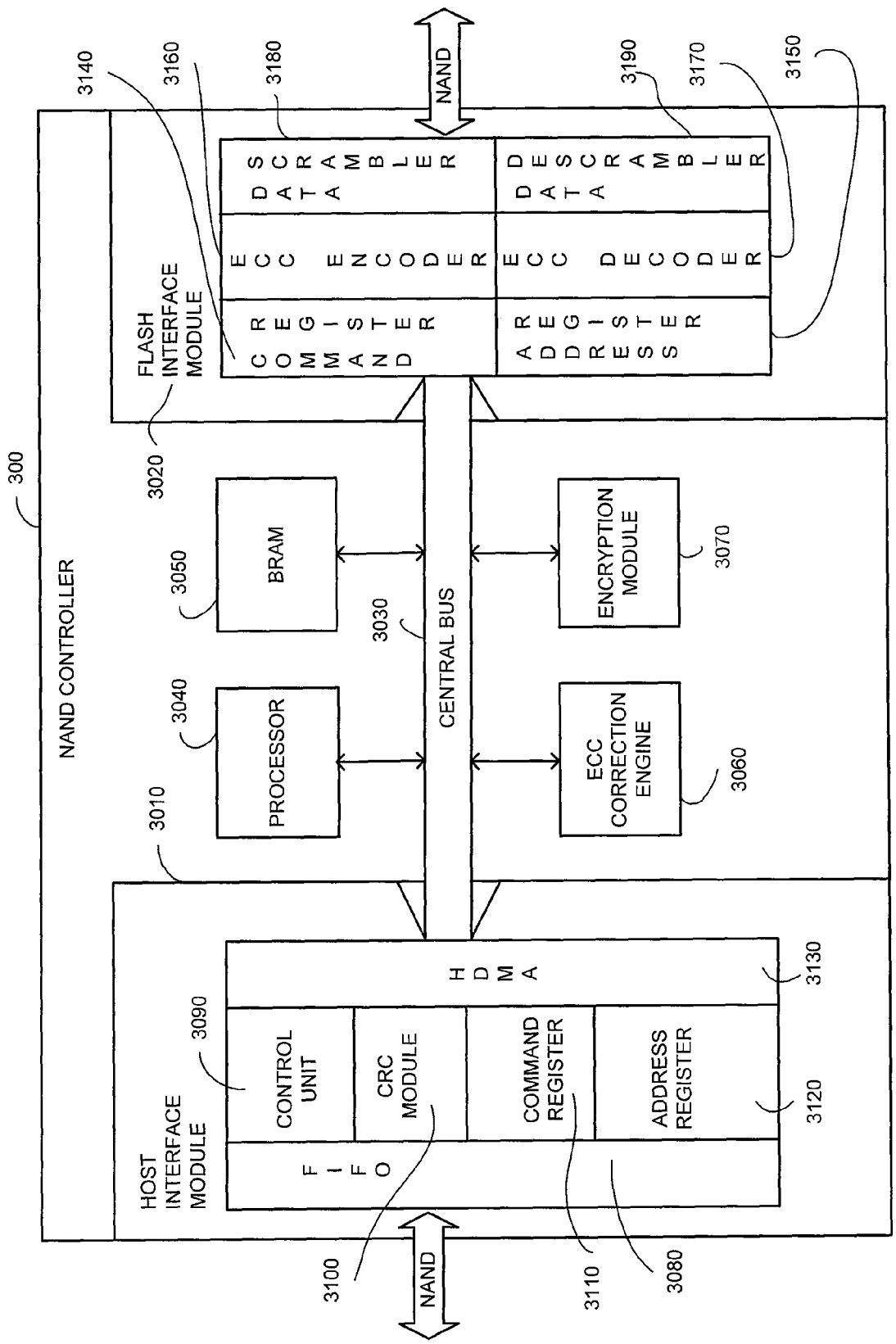
FIGS. 10A-10D are block diagrams of exemplary controllers of an embodiment.

Returning now to the drawings, FIG. 10A is a diagram of a presently preferred implementation of the NAND controller 300 of FIG. 9. It should be understood that any of the components shown in these drawings can be implemented as hardware, software/firmware, or a combination thereof. In this implementation, the first NAND Interface 325 in FIG. 9 is implemented by the Host Interface Module ("HIM") 3010. The HIM 3010 is a collection of logic that supports the "host side interface" as a "flash device-type interface." The HIM 3010 comprises a first-in-first-out ("FIFO") module 3080, a control unit 3090, a cyclic redundancy check ("CRC") module 3100 (although another type of error detection code ("EDC") module can be used), a command register 3110, an address register 3120, and a host direct memory access ("HDMA") unit 3130. In this embodiment, the HIM 3010 takes the form of an ONFI HIM. As will be discussed in more detail below, some HIMs receive a high-level request from a host controller for a relatively-large amount of data that spans several pages, and the NAND controller determines what actions are needed to satisfy the request. In contrast, an ONFI HIM receives several smaller-sized requests (e.g., for individual pages) from a host controller, so the ONFI HIM is required to simultaneously handle multiple (e.g., eight) read and write requests.

Returning to FIG. 10A, the second NAND Interface 335 of FIG. 9 is implemented here by a Flash Interface Module ("FIM") 3020. In a current embodiment, the FIM 3020 is implemented as a collection of logic and a low-level programmable sequencer that creates the "device side interface" as a "host-type interface." In this embodiment, the FIM 3020 comprises a command register 3140, an address register 3150, an ECC encode module 3160, an ECC decode module 3170, a data scrambler 3180, and a data descrambler 3190.

Internal to the NAND controller 300 is a processor 3040, which has local ROM, code RAM, and data RAM. A central bus 3030 connects the processor 3040, the HIM 3010, the FIM 3020, and the other modules described below and is used to transfer data between the different modules shown. This bi-directional bus 3030 may be either an electrical bus with actual connections to each internal component or an Advanced High-Speed Bus ("AHB") used in conjunction with an ARC microprocessor, which logically connects the various modules using an interconnect matrix. The central bus 3030 can transmits data, control signals, or both. The NAND controller 300 also comprises a buffer RAM ("BRAM") 3050 that is used to temporarily store pages of data that are either being read or written, and an ECC correction engine 3060 for correcting errors. The NAND controller 300 further comprises an encryption module 3070 for performing encryption/decryption functions.

The NAND controller 300 can further comprise a column replacement module, which is implemented here by either the FIM sequencer, firmware in the processor 3040, or preferably in a small amount of logic and a table located in the FIM 3020. The column replacement module allows the flash memory device(s) 330 (FIG. 9) to contain information on bad column locations. The bad column address information is contained in the flash memory device(s) 330 and is scanned by firmware prior to any read or write operation. After firmware scans the flash memory device(s) 330, it builds a bad column address table with the bad column location to be used by the column replacement module. On flash write operations, the column replacement module inserts the data (0xFFFF) for the address that is detected in a bad column address table. On flash read operations, data from the bad column address will be discarded.

With the components of the NAND controller 300 now generally described, exemplary write and read operations of the NAND controller 300 will now be presented. Turning first to a write operation, the FIFO 3080 in the HIM 3010 acts as a buffer for an incoming write command, address, and data from a host controller and synchronizes those elements to the system card domain. The CRC module 3100 checks the incoming information to determine if any transmission errors are present. (The CRC module 3100 is an example of the EDC module discussed above.) The CRC module generates or checks an error detection code to check for transmission errors as part of an end-to-end data protection scheme. If no errors are detected, the control unit 3090 decodes the command received from the FIFO 3080 and stores it in the command register 3110, and also stores the address in the address register 3120. The data received from the host controller is sent through the HDMA AHB interface 3130 to the BRAM 3050 via the central bus 3030. The control unit 3090 sends an interrupt to the processor 3040, in response to which the processor 3040 reads the command from the command register 3080 and the address register 3120 and, based on the command, sets up the data path in the FIM 3020 and stores the command in the FIM's command register 3140. The processor 3040 also translates the address from the NAND interface 325 into an internal NAND address and stores it in the FIM's address register 3150. If logical-to-physical address conversion is to be performed, the processor 3040 can use a mapping table to create the correct physical address. The processor 3040 can also perform one or more additional functions described below. The processor 3040 then sets up a data transfer from the BRAM 3050 to the FIM 3020.

The FIM 3020 takes the value from the address register 3150 and formats it in accordance with the standard of the NAND interface 335. The data stored in the BRAM 3050 is sent to the encryption module 3070 for encryption and is then sent through the data scrambler 3180. The data scrambler 3180 scrambles the data and outputs the data to the FIM's ECC encoder 3160, which generates the ECC parity bits to be stored with the data. The data and ECC bits are then transferred over the second NAND interface with the write command to the flash memory device(s) for storage. As an example of an additional function that may occur during writes, if protection for write aborts or program failures is enabled and if the write request is to an upper page address, the processor 3040 can send a read command to the flash memory device(s) over the second NAND interface for the corresponding lower page and then send a program command to have it copied into a safe zone (a spare scratchpad area) by writing it back to another location in the flash memory device(s) 330. If an error occurs in writing the upper page, the lower page can still be read back from the safe zone and the error corrected. (This is an example of the module discussed above for handling write aborts and/or program failures via safe zones.)

Turning now to a read operation, the HIM 3010 receives a read command from a host controller, and the processor 3040 reads the command and logical address. If logical-to-physical address conversion is to be performed, the firmware in the processor 3040 could use a mapping table to create the correct physical address. (This is an example of the address mapping module discussed above.) The firmware then sends the physical address over the second NAND interface 335 to the flash memory device(s) 330. After the read access, the data is transferred over the NAND interface, decoded and used to generate the syndrome data for error correction, descrambled by the data descrambler 3190, and then sent over the central bus 3030 to the BRAM 3050. The ECC correction engine 3060 is used to correct any errors that can be corrected using the ECC on the data that is stored in the BRAM 3050. Since the ECC may be computed and stored in portions of a physical page, the processor 3040 can be interrupted as each portion of the page is received or corrected, or once when all of the data is transferred. The encryption module 3070 then performs a decryption operation on the data. The timing described above is flexible since the first NAND interface 325 and the second NAND interface 335 may operate at different speeds, and the firmware can transfer the data using either store-and-forward techniques or speed-match buffering. When the data is sent back to the host controller, it is sent through the HIM 3010, and the transmission CRC is sent back to the host over the first NAND interface 325 to check for transmission error.

As mentioned above, in addition to handling commands sent from the host controller, the processor 3040 may perform one or more additional functions asynchronously or independent of any specific command sent by the host. For example, if the ECC correction engine 3060 detects a correctable soft error, the ECC correction engine 3060 can correct the soft error and also interrupt the processor 3040 to log the page location so that the corresponding block could be read scrubbed at a later point in time. Other exemplary background tasks that can be performed by the processor 3040 are wear leveling and mapping of bad blocks and spare blocks, as described below.

Figure 10B:
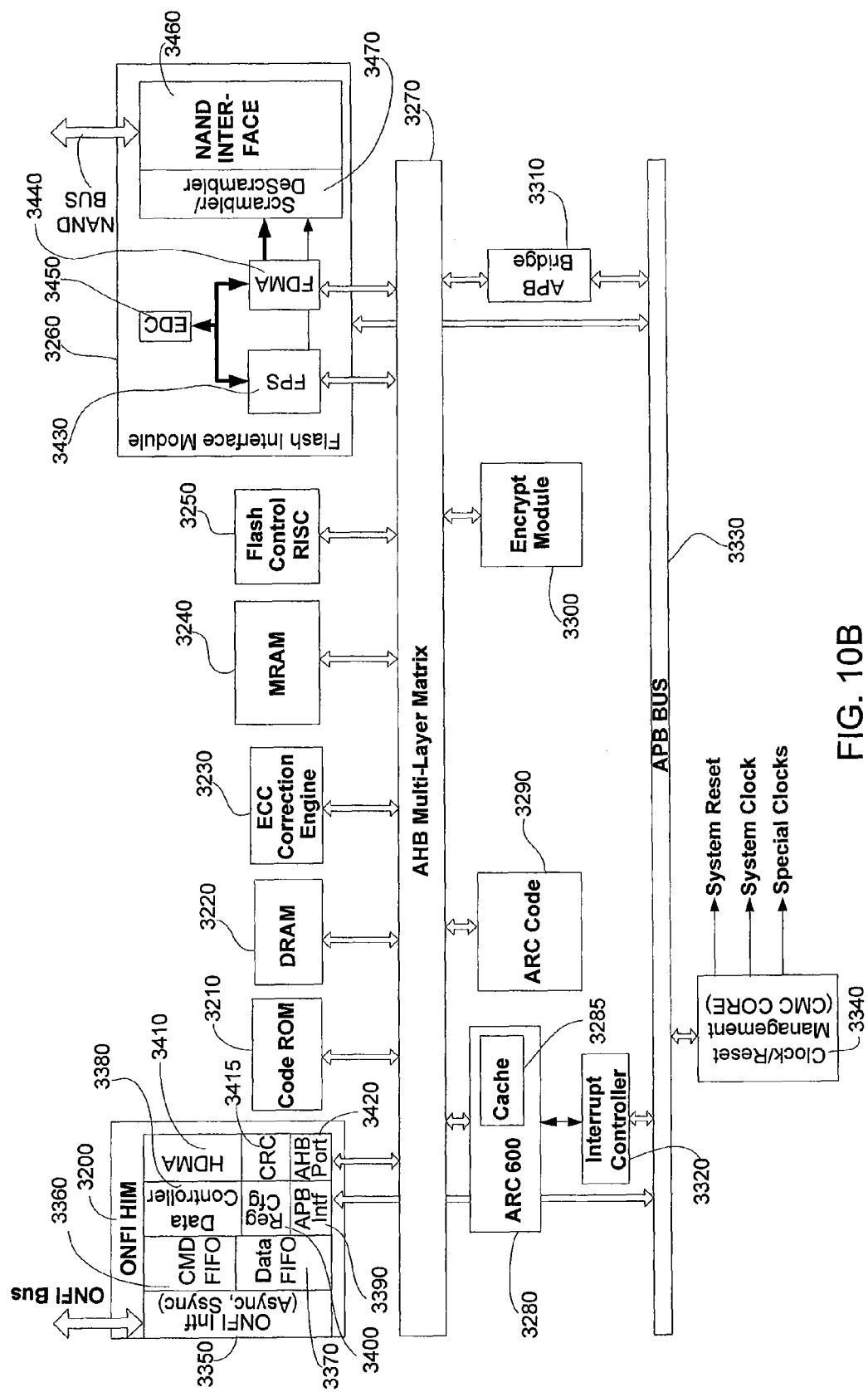

Turning again to the drawings, FIG. 10B is a block diagram showing a more detailed view of a NAND controller of an embodiment. As with the controller shown in FIG. 10A, the controller in this embodiment contains an ONFI HIM 3200 and a FIM 3260 that communicate through a central bus (here, an Advanced Microcontroller Bus Architecture ("AMBA") High-performance Bus ("AHB") multi-layer matrix bus 3270 for the data path and an advanced peripheral bus ("APB") 3330 for the command path). The ONFI HIM 3200 and the FIM 3260 can be associated with any of the processors. For example, the ONFI HIM 3200 can be associated with an ARC600 microprocessor 3280 (with a built-in cache 3285) that runs ARC code stored in a MRAM 3290. In general, the ARC600 3280 is used to service interrupts from the ONFI HIM 3200 and manages the data path setup and transfers information to the flash control RISC 3250. The flash control RISC 3250 is the microprocessor that can be used with the FIM 3260 and, in general, handles the function of setting up the FIM 3260 by generating micro-control codes to various components in the FIM 3260. More particularly, the flash control RISC 3250 sets up the flash direct memory access ("FDMA") module 3440 in the FIM 3260, which communicates with the AHB bus 3270 and generates the AHB bus protocol commands to read data from the DRAM 3220. The flash control RISC 3250 also sets up the EDC module 3450, which contains the ECC encoder and decoder. The MRAM 3240 stores code used to run the flash control RISC 3250.

The NAND controller in this embodiment also contains a ROM 3210 that stores instruction code to get the controller running upon boot-up. Additional components of the NAND controller include a DRAM 3220, an ECC correction engine 3230, an encrypt module 3300, an APB bridge 3310, an interrupt controller 3320, and a clock/reset management module 3340.

The encryption module 3300 enciphers and deciphers 128 bit blocks of data using either a 128, 192, or 256 bit key according to the Advanced Encryption Standard (AES). For write operations, after data is received from the host and sent to the BRAM 3050 (FIG. 10A) by the ONFI HIM, the ARC600 processor 3280 creates a control block with defined parameters of the encipher operations. The encryption module 3300 then performs the encipher operations and stores the resulting data to BRAM 3050 and interrupts the ARC600 processor 3280 to indicate that the data is ready. For read operations, after the ECC engine completes error correction in the BRAM 3050, the ARC600 processor 3280 creates a control block with defined parameters of the decipher operations. The encryption module 3300 then performs the decipher operations and stores the resulting data to the BRAM 3050 and interrupts the ARC600 processor 3280 to indicate data is ready.

Turning now to the ONFI HIM 3220 and the FIM 3260 in more detail, the ONFI HIM 3220 comprises an ONFI interface 3350 that operates either in an asynchronous mode or a source synchronous mode, which is part of the ONFI standard. (Asynchronous (or "async") mode is when data is latched with the WE# signal for writes and the RE# signal for reads. Source synchronous (or "source (src) sync") is when the strobe (DQS) is forwarded with the data to indicate when the data should be latched.) The ONFI HIM 3200 also contains a command FIFO 3360, a data FIFO 3370, a data controller 3380, a register configuration module 3400, a host direct memory access ("HDMA") module 3380, and a CRC module 3415, which function as described above in conjunction with FIG. 10A. The ONFI HIM 3200 further contains an APB interface 3390 and an AHB port 3420 for communicating with the APB bus 3330 and the AHB bus 3270, respectively. The FIM 3260 comprises an EDC module 3450 that includes an EDC encoder and an EDC decoder, a flash protocol sequencer ("FPS") 3430, which generates commands to the NAND bus based on micro-control codes provided by the flash control RISC 3250 or the ARC600 microprocessor 3280, an FDMA 3440, a data scrambler/de-scrambler 3470 and a NAND interface 3460.

The scrambler/descrambler 3470 performs a transformation of data during both flash write transfers (scrambling) and flash read transfers (de-scrambling). The data stored in the flash memory device(s) 330 may be scrambled in order to reduce data pattern-dependent sensitivities, disturbance effects, or errors by creating more randomized data patterns. By scrambling the data in a shifting pattern across pages in the memory device(s) 330, the reliability of the memory can be improved significantly. The scrambler/descrambler 3470 processes data on-the-fly and is configured by either the ARC600 processor 3280 or the Flash Control RISC 3250 using register accesses. ECC check bit generation is performed after scrambling. ECC error detection is performed prior to de-scrambling, but correction is performed after descrambling.

The NAND controller in this embodiment processes write and read operations generally as described above with respect to FIG. 10A. For example, for a write operation, the command FIFO 3360 and the data FIFO 3370 store an incoming write command and data, and the CRC module 3415 checks the incoming information to determine if any transmission errors are present. If no errors are detected, the data controller 3380 decodes the command received from the command FIFO 3360 and stores it in a command register in the register configuration module 3400. The address received from the host controller is stored in the address register in the register configuration module 3400. The data received from the host controller is sent through the HDMA 3410 to the DRAM 3220. The data controller 3380 then sends an interrupt to the ARC600 3280 or the Flash Control RISC 3250, which reads the command from the command register, reads the address from the address register, and passes control to the flash control RISC 3250 to set up the FIM 3260 to start reading the data from DRAM 322 and perform ECC and data scrambling operations, the result of which is sent to the flash memory device(s) 330 for storage. The ARC600 microprocessor 3280 and/or the FIM 3260 can perform additional operations. For example, the FIM 3260 can perform column replacement, and the following operations can be performed using the ARC600 microprocessor 3280 together with the FIM 360: bad block and spare block management, safe zones, read scrubbing, and wear leveling. These operations are described in more detail below.

For a read operation, the ONFI HIM 3200 sends an interrupt to the ARC600 microprocessor 3280 when a read command is received. The ARC600 microprocessor 3280 then passes the command and address information to the flash control RISC 3250, which sets up the FPS 3430 to generate a read command to the NAND flash memory device(s) 330. Once the data is ready to be read from the NAND flash memory device(s) 330, the FPS 3430 starts sending read commands to the NAND bus. The read data goes through the NAND interface unit 3460 to the data descrambler 3470 and then through the EDC module 3450, which generates the syndrome bits for ECC correction. The data and syndrome bits are then passed through the FDMA 3440 and stored in the DRAM 3220. The flash control RISC 3250 then sets up the ECC correction engine 3230 to correct any errors. The encrypt module 3300 can decrypt the data at this time. The ARC600 microprocessor 3280 then receives an interrupt and programs the register configuration module 3400 in the ONFI HIM 3200 to state that the data is ready to be read from the DRAM 3220. Based on this information, the ONFI HIM 3200 reads the data from the DRAM 3220 and stores it in the data FIFO 3370. The ONFI HIM 3200 then sends a ready signal to the host controller to signal that the data is ready to be read.

As mentioned above, unlike other HIMs, an ONFI HIM receives several smaller-sized requests (e.g., for individual pages) from a host controller, so the ONFI HIM is required to simultaneously handle multiple (e.g., eight) read and write requests. In this way, there is more bi-directional communication between the ONFI HIM and the host controller than with other HIMs. Along with this increased frequency in communication comes more parallel processing to handle the multiple read and write requests.

Figure 10C:
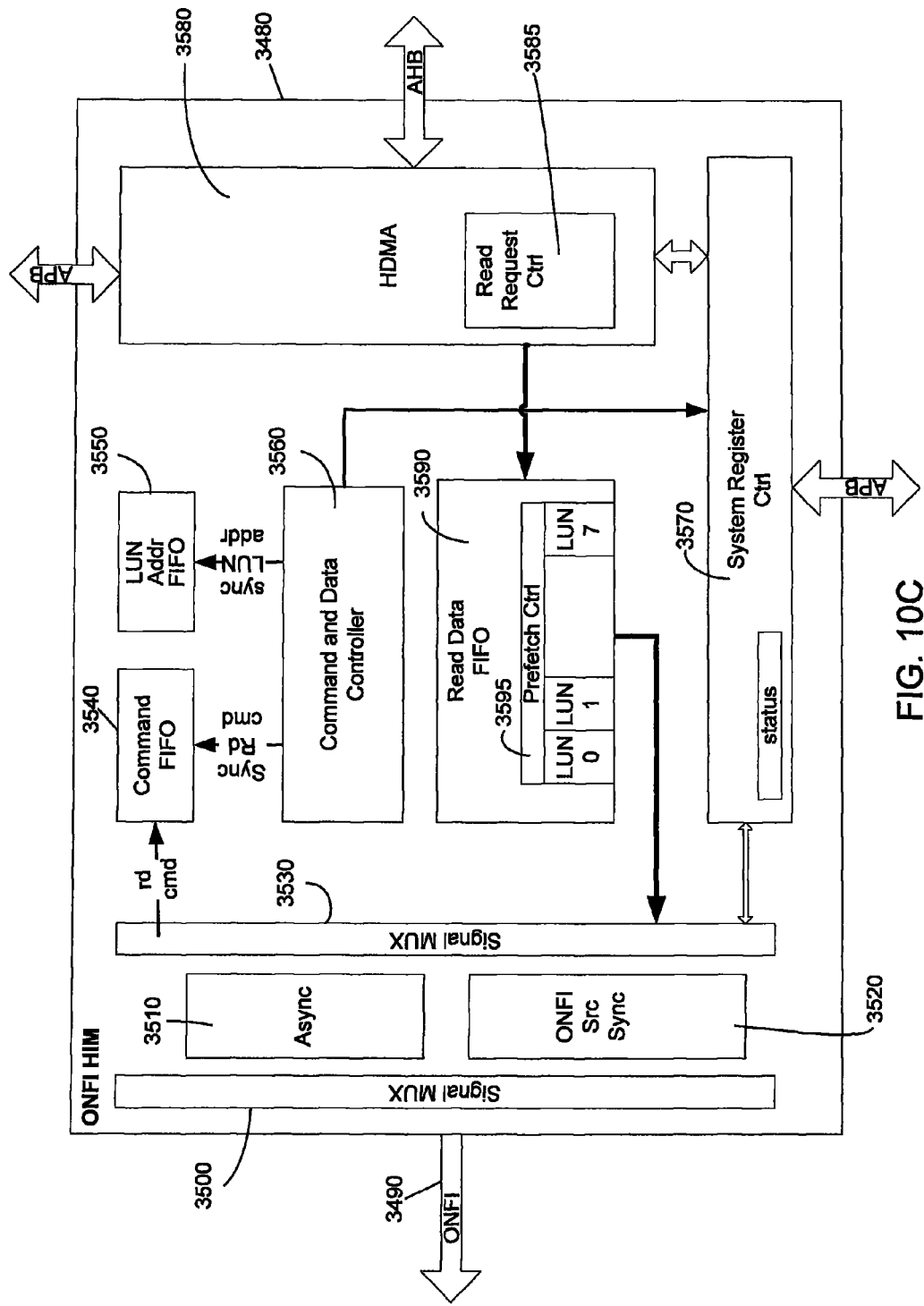
Figure 10D:
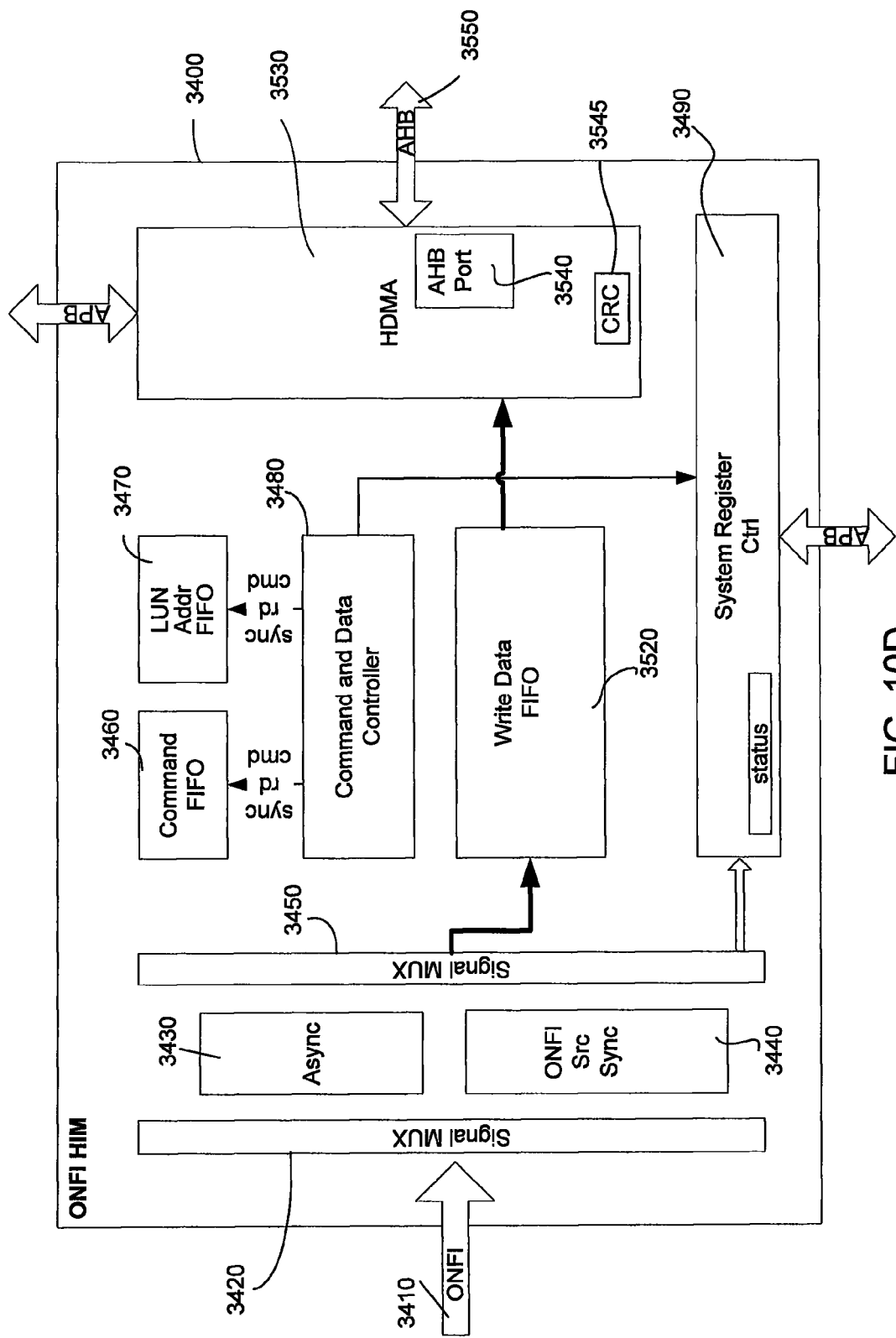

FIGS. 10C and 10D illustrate the logical operations of an ONFI HIM for read and write operations, respectively. Turning first to FIG. 10C, the ONFI HIM 3480 of this embodiment receives a read command from a host controller through an ONFI bus 3490. The ONFI HIM 3480 can operate in an asynch or a source synch mode and communicates the read command to a command FIFO 3540 via signal multiplexors 3500, 3530. (The ONFI HIM 3480 can be used in an async mode and source sync mode using the Async and ONFI source sync components 3510, 3520, respectively.) The ONFI HIM 3480 also stores the address received from the host controller in a logical unit number ("LUN") address FIFO 3550. (The NAND controller in this embodiment supports multiple logical units, which are treated as independent entities that are addressable by LUN addresses.) The command and address are read from the FIFOs 3540, 3550 into a command and data controller 3560, which synchronizes these items. The command and data controller 3560 then sends an interrupt to the system register controller 3570, which generates an interrupt to the ARC600 microcontroller. The ARC600 microcontroller then reads the LUN address from the register in the system register controller 3570, and the process of reading data from the flash memory device(s) is as described above. When all the read data is written to the DRAM, the ARC600 microprocessor program the status register in the system register controller 3570 to inform the ONFI HIM 3480 that the data is ready to be read. The ONFI HIM 3480 then reads the data through the HDMA 3580 using the read request control unit 3585. The read data is stored in the read data FIFO 3590, which is partitioned for each LUN 3595. Once that is done, a ready indicator is stored in the status register, and the data is streamed to the host controller.

Turning now to FIG. 10D, in a write operation, a write command is received from a host controller through an ONFI 3410 bus. The ONFI HIM 3400 communicates the write command to a command FIFO 3460 via signal multiplexors 3420, 3450. (The ONFI HIM 3400 can be used in an async mode and source sync mode using the Async and ONFI source sync components 3430, 3440, respectively.) The ONFI HIM 3400 also stores the address received from the host controller in a logical unit number ("LUN") address FIFO 3470. The data received from the host controller is stored in a write data FIFO 3520. The command and address are read from the FIFOs 3460, 3470 into a command and data controller 3480, which synchronizes these items. The command and data controller 3480 then sends an interrupt to the system register controller 3490, which generates an interrupt to the ARC600 microcontroller. The ARC600 microcontroller then reads the LUN address from the register in the system register controller 3490, and the process of setting-up the controller from a write operation is as described above. The HDMA 3530 has an AHB port 3540 in communication with the AHB bus 3550 and sends the data to the DRAM. The CRC module 3545 checks for transmission errors in the data. Once the data has been stored in the flash memory device(s) 330 and the flash memory device(s) 330 indicate ready and the status of program operation is successful or fail, a ready indicator is stored in the status register in the system register controller 3490, indicating that the ONFI HIM 3400 is ready for another command from the host controller.

Returning to FIG. 10A, the NAND controller 300 can also handle program failures and erase failures. As the NAND flash memory device(s) 330 attached to the flash interface module 3020 (hereafter FIM) are programmed, the NAND memory device(s) 330 report the success or failure of the program operation to the NAND controller 300 (or optionally to the ONFI Host through the host interface module 3010 (hereafter HIM)). The NAND memory device(s) 330 may experience some number of program failures over the expected life of the memory due to defects in the NAND cells or due to the limited endurance the NAND cells have with regard to erase and program cycles.

The NAND memory device(s) 330 will return a FAIL status to the controller 300 when the program page operation does not complete successfully. The controller processor 3040 (FIG. 10A) or flash protocol sequencer 3430 (FIG. 10B) verifies the success or failure of each program page operation. Generally, the failure of any single program page operation will cause the processor 3040 (or optionally the ONFI Host) to regard the entire NAND block (which may contain multiple pages) to be defective. The defective block will be retired from use. Typically, the controller 300 will copy the data that was not successfully programmed and any data in preceding pages in the defective block to another replacement block (a spare block). The controller 300 may read preceding pages into the BRAM 3050 using the FIM 3020, the data de-scrambler 3190, and the ECC decoder 3170 and applying ECC correction as needed. The data is then written to the replacement block using the FIM 3020 in the normal fashion.

One aspect of program failures is that a failure programming one page may corrupt data in another page that was previously programmed. Typically, this would be possible with MLC NAND memory which is organized physically with upper and lower logical pages sharing a word-line within the memory array. A typical usage would be to program data into a lower page and subsequent data into the upper page. One method to prevent the loss of data in the lower page when a program failure occurs when programming the upper page on the word-line is to read the lower page data prior to programming the upper page. The lower page data could be read into the controller BRAM 3050 and could additionally be programmed into a scratch pad area in the non-volatile flash memory device(s) 330, sometimes called a "safe zone." The data thus retained in the BRAM 3050 or safe zone would then be protected from loss due to a programming failure and would be available to be copied to the replacement block, particularly in cases where the data was corrupted in the lower page of the NAND memory device(s) 330 and could no longer be read successfully.

It is possible that some NAND failure modes could similarly corrupt data in other areas of the memory array, such as on adjacent word lines. This method of reading other potentially vulnerable data into the controller BRAM 3050, and/or saving the data into a scratch pad or safe zone area could also be used to protect data in these circumstances.

As the NAND flash memory device(s) 330 attached to the FIM 3020 are erased, the NAND memory device(s) 330 report the success or failure of the block erase operation to the NAND controller 300 (or optionally to the ONFI Host through the HIM 3010). The NAND memory device(s) 330 will return a FAIL status to the controller 300 when the erase operation does not successfully complete. The controller processor 3040 or circuits in the flash protocol sequencer 3430 verifies the success or failure of each erase operation. Generally, the failure of any erase operation will cause the processor 3040 (or ONFI Host) to regard the entire NAND block to be defective. The defective block will be retired from use and a spare block used in its place.

The NAND controller 300 can also handle program disturbs, erase disturbs, and read disturbs within the flash memory device.

The internal NAND programming operations could possibly effect, or disturb, other areas of the memory array, causing errors when attempting to read those other areas. One method to prevent failures from program disturb is to perform reads or "read scrubbing" operations on potentially vulnerable areas in conjunction with programming operations, in order to detect disturb effects before they become uncorrectable or unrecoverable errors. Once a disturb condition is detected (by high soft error rates during the read scrubbing operation), the controller processor 3040 (or the external ONFI host) can copy the data to another area in the flash memory device(s) 330.

The internal NAND erase operations could possibly effect, or disturb other areas of the memory array, causing errors when attempting to read those other areas. One method to prevent failures from erase disturb is to perform reads or "read scrubbing" operations on potentially vulnerable areas in conjunction with erase operations, in order to detect disturb effects before they become uncorrectable or unrecoverable errors. Once a disturb condition is detected, the controller processor 3040 (or the external ONFI host) can copy the data to another area in the flash memory device(s) 330.

The internal NAND read operations could possibly effect, or disturb other areas of the memory array, causing errors when attempting to read those other areas. The disturb effects can sometimes accumulate over many read operations. One method to prevent failures from program disturb is to perform reads or "read scrubbing" operations on potentially vulnerable areas in conjunction with read operations, in order to detect disturb effects before they become uncorrectable or unrecoverable errors. Once a disturb condition is detected, the controller processor 3040 (or the external ONFI host) can copy the data to another area in the flash memory device(s) 330.

Referring now to FIG. 10A, the NAND controller 300 handles read errors in the following manner. Typically, the data that is programmed into the NAND memory device(s) 330 through the FIM 3020 has an error detection or error correction code appended and stored with the data in the NAND array. The controller 300 uses the ECC encoder 3160 for this function. When such data is read from the flash array to the BRAM 3050, the ECC decoder 3170 re-generates the ECC code from the data and compares it to the ECC code that was appended to the data when programmed into the flash. If the data is identical to the data that was written, the ECC circuits indicate that there is no data error present. If some difference in the read data is detected, and the difference is small enough to be within the capability of the ECC to correct, the read data (typically contained in the BRAM 3050) is "corrected" or modified to restore it to the original value by the ECC correction engine 3060, as controlled by the processor 3040. If the data errors exceed the ECC correction capability, an "uncorrectable" read error occurs. Typically, an uncorrectable read error would result in an error status being returned to the Host interface when read.

One method to prevent uncorrectable read errors, or to recover when an error is detected, is for the controller 300 (or the external ONFI host) to retry the read operation. The retry may use shifted margin levels or other mechanisms to decrease the errors within the data, perhaps eliminating the errors or reducing the number of errors to a level that is within the ECC correction capability.

Optionally, when a read error is recovered, or if the amount of ECC correction needed to recover the data meets or exceeds some threshold, the data could be re-written to the same or to another block in order to restore the data to an error-free or improved condition. The original data location may optionally be considered as defective, in which case it could be marked as defective and retired from use.

Referring again to FIG. 10A, the NAND controller 300 can also handle write aborts. Write aborts are the unexpected loss of power to the controller 300 and NAND memory device(s) 330 while a program or erase operation is in progress. The loss of power can result in incomplete programming or erase conditions in the NAND memory device(s) 330 that could result in uncorrectable read errors. In some cases, such as with MLC NAND, other pages that share a word line (i.e., a lower page) could be corrupted by an aborted program operation on the upper page of a word line, much like the program failure condition described above.

There are several methods to reduce or eliminate write abort errors, or minimize their impact. One method is to use a low voltage detection circuit to notify the processor 3040 that the power has been interrupted. The processor 3040 can then allow current program or erase operations to finish but not allow new operations to start. Ideally, the current operations would have enough time with sufficient power to complete.

An alternative method, perhaps used in conjunction with the low voltage detection method, is to add capacitance or a battery (or some alternative power supply source) to the power supply circuits to extend the power available to complete program or erase operations.

Another method is to provide a scratch pad "safe zone" similar to that described above. Any "old" data that exists in lower pages that may be vulnerable during an upper page program could be read and saved in the safe zone before the upper page program is started. That would provide protection for previously-programmed data in case of a power loss event. In some implementations, it may be acceptable to not be able to read data that was corrupted in a write abort situation, but other possibly un-related older data must be protected.

Another method is to search for potential write abort errors when the controller is powered on. If an error is found that can be determined (or assumed) to be a result of a write abort, the error data may be discarded. In this situation, the controller 300 effectively reverts back to previous data, and the interrupted operation is as if it did not happen.

Referring again to FIG. 10A, the NAND controller 300 can also conduct wear leveling on the memory. Wear leveling is a method to increase overall product endurance and lifetime by more evenly distributing block usage amongst all physical blocks than would otherwise occur as a result of normal flash management algorithms. This is done by forcing "cold" blocks to the spare blocks pool, which will in turn be used for host data updates, and, at the same time, moving the data from "cold" blocks, which are not updated by the host, to a "hot" block. This swap will result in mixing up "hot" and "cold" blocks. The swap can be done either randomly or cyclically, choosing blocks for the swap, or choosing them on the basis of a hot count (number of program-erase cycles) analysis. The swap can be done periodically, say in every 100 block cycles, typically calibrated by a system parameter to balance between overall system performance and evening of block usage to balance wear and performance overhead.

An example high level sequence is:
1. Schedule wear leveling operation
2. Identify "hot" and "cold" blocks by either hot count analysis or on random or cyclic basis.
3. Copy data from the selected "cold" block to the selected "hot" free block in the free block pool.
4. Release the "cold" block to the free block pool. As a result, the free block pool is populated by a cold block instead of hot one.

Some operations can be skipped, like analysis-based blocks selection. The wear level operation itself can also be skipped if block wear distribution is detected as even.

The wear level operations and hot count management are performed in firmware by the processor 3040, such that the host controller 121 (FIG. 9) will not be aware of these housekeeping flash block level operations Referring to FIG. 10A, the controller 300 can also implement read scrubbing on the flash memory device(s) 330 upon detection of a read disturb. Read operations to one area of the NAND memory array within the flash memory device(s) 330 may affect or disturb other areas of the memory array, causing cells to shift from one state to another, and ultimately causing bit errors when attempting to read data previously stored to those other areas. The disturb effects can accumulate over many read operations, eventually leading to a number of bit errors that may exceed the data correction capabilities of the system. The errors that exceed the system correction capabilities are referred to as uncorrectable errors. One method to prevent failures from program disturbs is to perform reads or "scrubbing" operations on potentially vulnerable areas, in order to detect disturb effects before they become uncorrectable or unrecoverable errors. Once a disturb condition is detected, typically by detecting that there are a number of bits in error on the data read, the processor 3040 can move the data to another area in the memory generally by copying the data to another area of the NAND memory array in order to "refresh" it.

Read scrub copy is usually triggered by correctable ECC error discovered by the ECC correction engine 3060 (FIG. 10A), either in blocks read during the course of a host read operation, an internal system read operation, or by a scheduled read scrub scan. System read operations are those needed by the flash storage system to read firmware, parameters, or mapping information stored in the NAND flash. Read scrub scan is a read of all data in a block to determine whether any data contained therein has been disturbed. Blocks are selected for a read scrub scan typically when they have been partially read during the course of a host read or system read operation, but may also be selected using other criteria, such as randomly, or via deterministic sequencing through the blocks of memory. Because a read scrub scan operation takes time and affects data throughput of the system, the system may select blocks for read scrub scan only periodically or infrequently, by use of a random selection, a counter, or other mechanisms. The frequency of scheduling may be calibrated to balance between the system performance needs, and the frequency require to detect disturbed data before it becomes uncorrectable. Upon detection of a correctable error that has some number of bits in error above a pre-defined threshold, the read scrub copy is scheduled for the block.

Read scrub copy is a method by which data is read from the disturbed block and written to another block, after correction of all data which has correctable ECC error. The original block can then be returned to the common free block pool and eventually erased and written with other data. Read scrub scan and read scrub copy scheduling will be done in the NAND controller 300 in firmware by the processor 3040, such that the host controller 121 will not be aware of these housekeeping flash block level operations.

Finally, the following patent applications, which are being filed on the same day as the present application and are hereby incorporated by reference, provide additional embodiments that can be used with the embodiments presented herein: "Controller and Method for Interfacing Between a Host Controller in a Host and a Flash Memory Device," U.S. patent application Ser. No. 12/539,394; "Controller and Method for Detecting a Transmission Error Over a NAND Interface Using Error Detection Code," U.S. patent application Ser. No. 12/539,407; and "Controller and Method for Providing Read Status and Spare Block Management Information in a Flash Memory System," U.S. patent application Ser. No. 12/539,379.

CONCLUSION

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art.

What is claimed is:

1. A controller for interfacing between a host controller in a host device and a flash memory device, the controller comprising:
   a first NAND interface configured to transfer data between the host controller and the controller using a NAND interface protocol, wherein the first NAND interface is further configured to receive, from the host controller, (i) one of a read command and a write command and (ii) a logical address;
   an address conversion module configured to convert the logical address received from the host controller to a physical address of the flash memory device;
   a second NAND interface configured to transfer data between the controller and the flash memory device using a NAND interface protocol in accordance with the one of the read command and the write command received from the host controller;

an error correction code (ECC) module configured to calculate ECC bits for data received through at least one of the first and second NAND interfaces; and an additional functionality module.

2. The controller of claim 1, wherein the additional functionality module comprises a data scrambling module.

3. The controller of claim 1, wherein the additional functionality module comprises a column replacement module.

4. The controller of claim 1, wherein the additional functionality module comprises a module that handles at least one of a write abort and a program failure.

5. The controller of claim 1, wherein the additional functionality module comprises a read scrubbing module.

6. The controller of claim 1, wherein the additional functionality module comprises a wear leveling module.

7. The controller of claim 1, wherein the additional functionality module comprises a module that manages at least one of bad blocks and spare blocks.

8. The controller of claim 1, wherein the additional functionality module comprises an encryption module.

9. The controller of claim 1, wherein the NAND interface protocol used by the first NAND interface is the same as the NAND interface protocol used by the second NAND interface.

10. The controller of claim 1, wherein the NAND interface protocol used by the first NAND interface is different from the NAND interface protocol used by the second NAND interface.

11. The controller of claim 1, wherein a bus between the host device and the controller is different from a bus between the controller and the flash memory device.

12. A controller for interfacing between a host controller in a host device and a flash memory device, the controller comprising:

a first NAND interface configured to transfer data between the host controller and the controller using a NAND interface protocol, wherein the first NAND interface is further configured to receive, from the host controller, (i) one of a read command and a write command and (ii) a physical address of the flash memory device;

a second NAND interface configured to transfer data between the controller and the flash memory device using a NAND interface protocol in accordance with the one of the read command and the write command received from the host controller;

an error correction code (ECC) module configured to calculate ECC bits for data received through at least one of the first and second NAND interfaces; and an additional functionality module.

13. The controller of claim 12, wherein the additional functionality module comprises a data scrambling module.

14. The controller of claim 12, wherein the additional functionality module comprises a column replacement module.

15. The controller of claim 12, wherein the additional functionality module comprises a module that handles at least one of a write abort and a program failure.

16. The controller of claim 12, wherein the additional functionality module comprises a read scrubbing module.

17. The controller of claim 12, wherein the additional functionality module comprises a wear leveling module.

18. The controller of claim 12, wherein the additional functionality module comprises a module that manages at least one of bad blocks and spare blocks.

19. The controller of claim 12, wherein the additional functionality module comprises an encryption module.

20. The controller of claim 12, wherein the additional functionality module comprises an address mapping module.

21. The controller of claim 12, wherein the NAND interface protocol used by the first NAND interface is the same as the NAND interface protocol used by the second NAND interface.

22. The controller of claim 12, wherein the NAND interface protocol used by the first NAND interface is different from the NAND interface protocol used by the second NAND interface.

23. The controller of claim 12, wherein a bus between the host device and the controller is different from a bus between the controller and the flash memory device.

24. A method for interfacing between a host controller in a host device and a flash memory device, the method comprising:

performing in a controller in communication with the host controller and the flash memory device:

receiving (i) one of a read command and a write command and (ii) a logical address from the host controller, wherein (i) the one of the read command and the write command and (ii) the logical address are received through a first NAND interface of the controller using a NAND interface protocol;

converting the logical address received from the host controller to a physical address of the flash memory device;

transferring data between the host controller and the controller in accordance with the one of the read command and the write command received from the host controller, wherein the data is transferred through the first NAND interface of the controller using the NAND interface protocol;

transferring data between the controller and the physical address of the flash memory device in accordance with the one of the read command and the write command received from the host controller, wherein the data is transferred through a second NAND interface of the controller using a NAND interface protocol;

calculating error correction code (ECC) bits for the data received through at least one of the first and second NAND interfaces; and performing an additional function using an additional functionality module of the controller.

25. The method of claim 24, wherein performing the additional function comprises performing a data scrambling operation.

26. The method of claim 24, wherein performing the additional function comprises performing a column replacement operation.

27. The method of claim 24, wherein performing the additional function comprises handling at least one of a write abort and a program failure.

28. The method of claim 24, wherein performing the additional function comprises performing a read scrubbing operation.

29. The method of claim 24, wherein performing the additional function comprises performing a wear leveling operation.

30. The method of claim 24, wherein performing the additional function comprises managing at least one of bad blocks and spare blocks.

31. The method of claim 24, wherein performing the additional function comprises performing an encryption operation.

32. The method of claim 24, wherein the NAND interface protocol used by the first NAND interface is the same as the NAND interface protocol used by the second NAND interface.

33. The method of claim 24, wherein the NAND interface protocol used by the first NAND interface is different from the NAND interface protocol used by the second NAND interface.

34. The method of claim 24, wherein a bus between the host device and the controller is different from a bus between the controller and the flash memory device.

35. A method for interfacing between a host controller in a host device and a flash memory device, the method comprising:
   performing in a controller in communication with the host controller and the flash memory device:
      receiving (i) one of a read command and a write command and (ii) a physical address of the flash memory device from the host controller, wherein (i) the one of the read command and the write command and (ii) the physical address are received through a first NAND interface of the controller using a NAND interface protocol;
      transferring data between the host controller and the controller in accordance with the one of the read command and the write command received from the host controller, wherein the data is transferred through the first NAND interface of the controller using the NAND interface protocol;
      transferring data between the controller and the physical address of the flash memory device in accordance with the one of the read command and the write command received from the host controller, wherein the data is transferred through a second NAND interface of the controller using a NAND interface protocol;
      calculating error correction code (ECC) bits for the data received through at least one of the first and second NAND interfaces; and
      performing an additional function using an additional functionality module of the controller.

36. The method of claim 35, wherein performing the additional function comprises performing a data scrambling operation.

37. The method of claim 35, wherein performing the additional function comprises performing a column replacement operation.

38. The method of claim 35, wherein performing the additional function comprises handling at least one of a write abort and a program failure.

39. The method of claim 35, wherein performing the additional function comprises performing a read scrubbing operation.

40. The method of claim 35, wherein performing the additional function comprises performing a wear leveling operation.

41. The method of claim 35, wherein performing the additional function comprises managing at least one of bad blocks and spare blocks.

42. The method of claim 35, wherein performing the additional function comprises performing an encryption operation.

43. The method of claim 35, wherein the NAND interface protocol used by the first NAND interface is the same as the NAND interface protocol used by the second NAND interface.

44. The method of claim 35, wherein the NAND interface protocol used by the first NAND interface is different from the NAND interface protocol used by the second NAND interface.

45. The method of claim 35, wherein a bus between the host device and the controller is different from a bus between the controller and the flash memory device.

* * * * *